United States Patent [19]
Kimura

[11] Patent Number: 6,107,858
[45] Date of Patent: Aug. 22, 2000

[54] OTA SQUARER AND HYPERBOLIC SINE/COSINE CIRCUITS USING FLOATING TRANSISTORS

[75] Inventor: Katsuji Kimura, Tokyo, Japan

[73] Assignee: NEC Corporation, Tokyo, Japan

[21] Appl. No.: 09/160,155

[22] Filed: Sep. 25, 1998

[30] Foreign Application Priority Data

Sep. 26, 1997 [JP] Japan ................................... 9-279543
Sep. 26, 1997 [JP] Japan ................................... 9-279544

[51] Int. Cl.[7] ........................................ G06F 7/556
[52] U.S. Cl. ..................... 327/349; 327/361; 327/561; 327/103
[58] Field of Search ................... 327/349, 361, 327/560, 561, 103, 356; 330/253

[56] References Cited

U.S. PATENT DOCUMENTS

| | | | |
|---|---|---|---|
| 5,430,337 | 7/1995 | Castello et al. | 327/103 |
| 5,485,119 | 1/1996 | Kimura | 327/349 |
| 5,578,965 | 11/1996 | Kimura | 327/357 |
| 5,581,211 | 12/1996 | Kimura | 327/357 |
| 5,617,052 | 4/1997 | Kimura | 327/356 |
| 5,712,594 | 1/1998 | Kimura | 330/256 |
| 5,909,136 | 6/1999 | Kimura | 327/356 |
| 5,909,137 | 6/1999 | Kimura | 327/359 |
| 5,925,094 | 7/1999 | Kimura | 327/357 |

FOREIGN PATENT DOCUMENTS

| | | |
|---|---|---|
| 0 344 855 | 12/1989 | European Pat. Off. . |
| 58-218209 | 12/1983 | Japan . |
| 62-144412 | 6/1987 | Japan . |
| 3-98304 | 4/1991 | Japan . |
| 3-274912 | 12/1991 | Japan . |
| 3-295306 | 12/1991 | Japan . |
| 4-220806 | 8/1992 | Japan . |
| 4-325508 | 12/1992 | Japan . |
| 62-272605 | 11/1997 | Japan . |
| 2 303 507 | 2/1997 | United Kingdom . |
| 2 308 032 | 6/1997 | United Kingdom . |

*Primary Examiner*—Terry D. Cunningham
*Attorney, Agent, or Firm*—Sughrue, Mion, Zinn, Macpeak & Seas, PLLC

[57] ABSTRACT

An OTA having a completely linear transconductance characteristic or a squarer having an accurate square-law characteristic is provided, which is comprised of first and second differential circuits. The first differential circuit has a first differential pair of first and second MOSFETs whose sources are coupled together and a third MOSFET serving as a bypass transistor for the first differential pair. The first differential pair is driven by a first constant tail current. The second MOSFET is driven by a first constant driving current. The second differential circuit has a second differential pair of fourth and fifth MOSFETs whose sources are coupled together and a sixth MOSFET serving as a bypass transistor for the second differential pair. The second differential pair is driven by a second constant tail current. The fifth MOSFET is driven by a second constant driving current. A differential input voltage is applied across gates of the first and second MOSFETs and across gates of the fifth and fourth MOSFETs. When a difference or sum of drain currents of the first and fourth MOSFETs is used as an output, an OTA or squarer is realized. If each of the MOSFETs in the first and second differential circuits is replaced with a bipolar transistor, a hyperbolic sine or hyperbolic cosine circuit is realized.

2 Claims, 14 Drawing Sheets

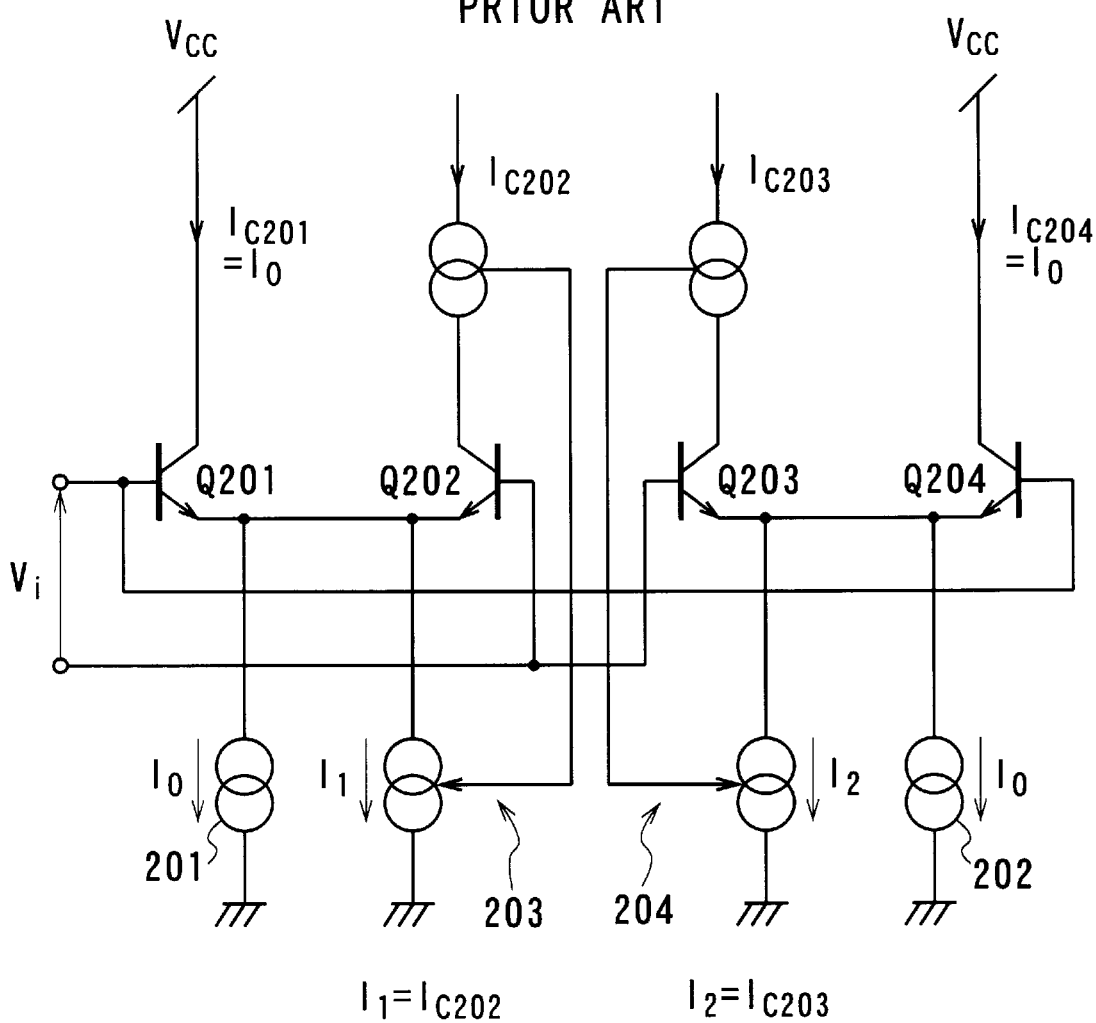

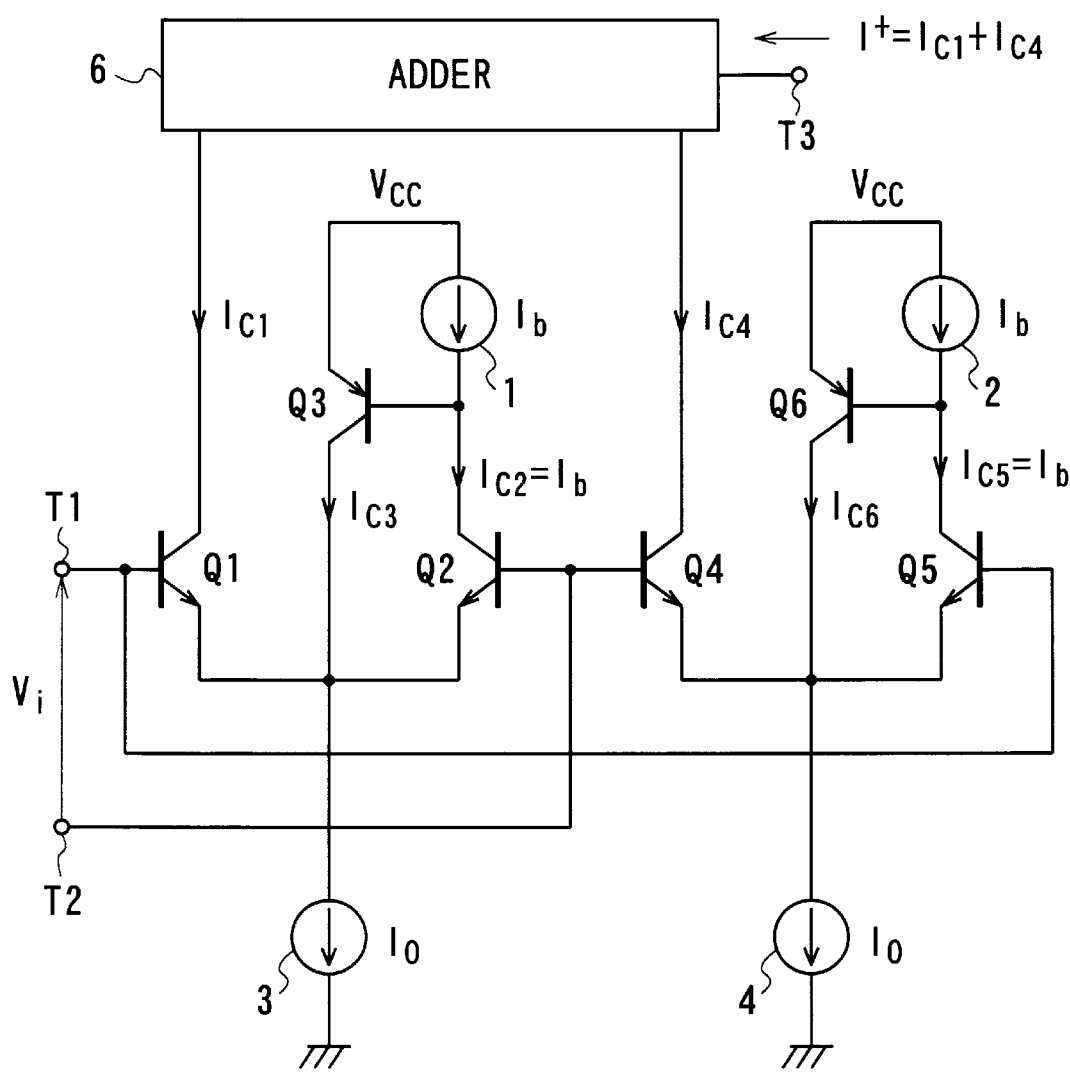

OTA SQUARER AND HYPERBOLIC SINE/COSINE CIRCUITS USING FLOATING TRANSISTORS

BACKGROUND OF THE INVENTION

1. Field of the Invention

The present invention relates to an OTA, a squarer, a hyperbolic sine circuit, and a hyperbolic cosine circuit and more particularly, to an OTA, a squarer, a hyperbolic sine circuit, and a hyperbolic cosine circuit each of which is comprised of "floating transistors", which are suitable for a semiconductor integrated circuit (IC).

2. Description of the Prior Art

A differential amplifier circuit having a superior transconductance linearity within a comparatively wide input voltage range has been known as an "Operational Transconductance Amplifier (OTA)".

A conventional Complementary Metal-Oxide-Semiconductor (CMOS) OTA is shown in FIG. 1, which is disclosed in the document (ECT-95-4) of an electronic-circuit study group in Institute of Electrical Engineers of Japan, written by N. Takai et al., and entitled "A Proposal of Linearization Technique of CMOS-OTA", published in Jan. 19, 1995.

As shown in FIG. 1, this conventional OTA includes three n-channel MOS Field-Effect Transistors (MOSFETs) M101, M102, and 103, a p-channel MOSFET M104, a constant current source 101 supplying a constant current $I_{B1}$, and a constant current sink 102 sinking a constant current $I_s$.

When the p-channel MOSFFT M104 has a transconductance parameter $\beta$, the transconductance parameters of the n-channel MOSFETs M101 and M102 are equal to $K_{12}\beta$, and the transconductance parameter of the n-channel MOSFET M103 is equal to $K_3\beta$, where $K_{12}$ and $K_3$ are constants greater than unity.

Sources of the MOSFETs M101, M102, M103, and M104 are coupled together and further connected through the constant current sink 102 to a power supply line applied with a voltage $-V_{SS}$.

Gates of the MOSFETs M101 and M102, which serve as input terminals of the conventional OTA, are applied with input voltages $V_1$ and $V_2$ with respect to the ground, respectively. In other words, a differential input voltage $V_i$ is applied across the gates of MOSFETs M101 and M102, where $V_i=V_1-V_2$.

Drains of the MOSFETs M101 and M102 serve as output terminals of the conventional OTA, from which a differential output current $\Delta I$ is derived.

A gate of the MOSFET M103 is applied with a constant voltage $V_B$ with respect to the ground. A drain of the MOSFET M103 is connected through the constant current source 101 to a power supply line applied with a voltage $V_{DD}$. The drain of the MOSFET M103 is further connected to a gate of the MOSFET M104. A drain of the MOSFET M104 is connected directly to the power supply line of $V_{DD}$.

Next, the operation of the conventional CMOS OTA shown in FIG. 1 is explained below.

Although circuit analysis is disclosed in the above document, this analysis is not sufficient and therefore, the circuit operation is very difficult to be understood. The following circuit analysis was carried out by the inventor, K. Kimura.

Here, it is supposed that the channel-length modulation and the body effect are ignored and that a drain current of a MOSFET varies with respect to a gate-to-source voltage of the MOSFET according to the square law.

Then, a drain current $I_D$ of a MOSFET is typically given as the following expression (1), where $\beta$ is a transconductance parameter, $V_{GS}$ is a gate-to-source voltage, and $V_{TH}$ is a threshold voltage.

$$I_D = \beta(V_{GS}-V_{TH})^2 \quad (1)$$

The transconductance parameter $\beta$ is defined as $$\beta = \frac{\mu C_{ox}}{2} \cdot \frac{W}{L}$$

where $\mu$ is the mobility of a carrier, $C_{ox}$ is the gate-oxide capacitance per unit area, and W and L are a gate width and a gate length of a MOSFET, respectively.

The constant voltage $V_B$ is adjusted to be equal to the middle-point voltage of the first and second input voltages $V_1$ and $V_2$. Also, the differential input voltage $V_i$ is equal to the difference between the first and second input voltages $V_1$ and $V_2$. Therefore, the following equations (2) and (3) are established.

$$V_B = \frac{(V_1 + V_2)}{2} \quad (2)$$

$$V_1 - V_2 = V_i \quad (3)$$

From the equations (2) and (3), the following equations (2') and (3') are obtained.

$$V_1 = V_B + \frac{V_i}{2} \quad (2')$$

$$V_2 = V_B - \frac{V_i}{2} \quad (3')$$

Here, a common source voltage at the coupled sources of the MOSFETs M101, M102, and M103 is defined as $V_S$. Then, gate-to-source voltages of the MOSFETs M101, M102, and M103 are expressed as $(V_1-V_S)$, $(V_2-V_S)$, and $(V_B-V_S)$ respectively. Therefore, using the equations (1), (2'), and (3'), drain currents $I_{D101}$, $I_{D102}$, and $I_{D103}$ of the MOSFETs M101, M102, and M103 are given by the following equations (4), (5), and (6), respectively.

$$I_{D101} = \beta(V_1 - V_S - V_{TH})^2 = \beta\left(\frac{V_i}{2} + V_B - V_S - V_{TH}\right)^2 \quad (4)$$

$$I_{D102} = \beta(V_2 - V_S - V_{TH})^2 = \beta\left(-\frac{V_i}{2} + V_B - V_S - V_{TH}\right)^2 \quad (5)$$

$$I_{D103} = \beta(V_B - V_S - V_{TH})^2 = I_{B1} \quad (6)$$

On the other hand, if a drain current of the MOSFET M104 is defined as $I_{D104}$, the drain currents $T_{D101}$, $I_{D102}$, $I_{D103}$, $I_{D104}$ of the MOSFETs M101, M102, M103, and M104 have the following relationship (7).

$$I_{D101}+I_{D102}+I_{D103}+I_{D104}=I_B \quad (7)$$

Using the above equations (4), (5), and (6), the differential output current $\Delta I$ of the conventional OTA is given by the following equation (8).

$$\Delta I = I_{D101} - I_{D102} \quad (8)$$

$$= \beta\left(\frac{V_i}{2} + V_B - V_S - V_{TH}\right)^2 - \beta\left(-\frac{V_i}{2} + V_B - V_S - V_{TH}\right)^2$$

$$= 2\beta V_i(V_B - V_S - V_{TH})$$

$$= 2V_i\sqrt{\frac{I_{B1}}{\beta}}$$

It is clearly seen from the equation (8) that the differential output current $\Delta I$ is correctly proportional to the applied differential input voltage $V_i$. This means that the circuit configuration shown in FIG. 1 realizes an OTA function.

The MOSFET M104 serves as a bypass transistor so that the drain currents $I_{D101}$, $I_{D102}$, and $I_{D103}$ flow through the respective MOSFETs M101, M102, and M103 according to the square-law while satisfying the equation (7).

The drain current $I_{D104}$ of the MOSFET M104 is given by the following equation (9).

$$I_{D104} = I_B - (I_{D101} + I_{D102} + I_{D103}) \quad (9)$$

$$= I_B - \beta\left(\frac{V_i}{2} + V_B - V_S - V_{TH}\right)^2 -$$

$$\beta\left(-\frac{V_i}{2} + V_B - V_S - V_{TH}\right)^2 -$$

$$\beta(V_B - V_S - V_{TH})^2$$

$$= I_B - 3I_{B1} - \beta\frac{V_i^2}{2}$$

It is clearly seen from the equation (9) that the drain current $I_{D104}$ includes a component proportional to the square of the applied differential input voltage $V_i$ (i.e., $V_i^2$). This means that a bypass current $ID_{104}$ expressed by the equation (9) flows through the MOSFET M104.

Due to the condition that the drain current $I_{D104}$ is greater than or equal to zero, i.e., $I_{D104} \geq 0$, the operable range of the differential input voltage $V_i$ is given as the following inequality (10).

$$|V_i| \leq \sqrt{2I_B - \frac{I_{B1}}{\beta}} \quad (10)$$

In the conventional CMOS OTA shown in FIG. 1, to produce the constant voltage $V_B$ equal to (½) $(V_1+V_2)$, a voltage divider circuit shown in FIG. 2 is used.

As shown in FIG. 2, source-coupled, n-channel MOSFETs M114 and M115 constitute a first balanced differential pair and source-coupled, n-channel MOSFETs M116 and M117 constitute a second balanced differential pair. The transconductance parameters β of the MOSFETs M114, M115, M116, and M117 are equal to each other.

The coupled sources of the MOSFETs M114 and M115 are connected to the power supply line of $-V_{SS}$ through a constant current sink 112 sinking a constant current $2I_S$. The coupled sources of the MOSFETs M116 and M117 are connected to the power supply line of $-V_{SS}$ through a constant current sink 113 sinking a same constant current $2I_S$ as the constant current sink 112.

A gate of the MOSFET M114 is applied with the first input voltage $V_1$ with respect to the ground. A gate of the MOSFET M117 is applied with the second input voltage $V_2$ with respect to the ground. Thus, the gates of the MOSFETs M114 and M117 serve as input terminals of this voltage divider circuit.

Gates of the MOSFETs M115 and M116 are coupled together to form an output terminal of the voltage divider circuit. The voltage $V_B$ is derived from the output terminal and the ground.

Drains of the MOSFETs M114 and M117 are commonly connected to the power supply line of $V_{DD}$. Drains of the MOSEETs M115 and M116 are coupled together to be connected to the coupled gates of the MOSFETs M115 and M116. The coupled drains of the MOSFETs M115 and M116 are further connected to the power supply line of $V_{DD}$ through a constant current source 111 supplying a same constant current $2I_S$ as the constant current sinks 112 and 113.

The operation of the voltage divider circuit is as follows.

If drain currents of the MOSFETs M114, M115, M116, and M117 are defined as $I_{D114}$, $I_{D115}$, $I_{D116}$, and $I_{D117}$, respectively, the following equations are established therebetween.

$$I_{D114}+I_{D115}=2I_S=I_{D116}+I_{D117}=I_{D115}+I_{D116}$$

Therefore, $$I_{D114}=I_{D116}$$

$$I_{D115}=I_{D117}$$

are established, which means that a differential input voltage applied across the gates of the MOSFETs M114 and M115 is equal to that of the MOSFETs M116 and M117.

Specifically, $$V_1 - V_B = V_B - V_2$$

$$\therefore V_B = \frac{V_1 + V_2}{2}$$

Thus, the wanted constant voltage $V_B=$(½) $(V_1+V_2)$ is outputted from the coupled gates of the MOSFETs M115 and M116 and the ground.

With the conventional CMOS OTA shown in FIG. 1, as described above, a completely linear transconductance characteristic is realized. However, there is a problem that an extra circuit is necessary to produce the middle-point voltage of the first and second input voltages $V_1$ and $V_2$, i.e., the constant voltage $V_B$. The extra circuit makes the circuit configuration complicated and enlarges the circuit scale.

FIG. 3 shows a conventional circuit capable of realizing a hyperbolic cosine function and a hyperbolic sine function, which is created by the inventor, K. Kimura. This circuit is disclosed in the Japanese Non-Examined Patent Publication No. 7-200710 published in 1995, which corresponds to the U.S. Pat. No. 5,754,076 issued on May 19, 1998.

As shown in FIG. 3, emitter-coupled npn-type bipolar transistors Q201 and Q202 constitute a first balanced differential pair, and emitter-coupled npn-type bipolar transistors Q203 and Q204 constitute a second balanced differential pair.

The emitter of the transistor Q201 is connected to the ground through a constant current sink 201 sinking a constant current $I_0$. The transistor Q201 is driven by the constant current $I_0$. The emitter of the transistor Q202 is connected to the ground through a current mirror subcircuit 203 supplying a mirror current $I_1$ equal to a collector current $I_{C202}$ of the transistor Q202.

Similarly, the emitter of the transistor Q204 is connected to the ground through a constant current sink 202 sinking a same constant current $I_0$ as the constant current sink 201. The transistor Q204 is driven by the constant current $I_0$. The emitter of the transistor Q203 is connected to the ground through a current mirror subcircuit 204 supplying a mirror current $I_2$ equal to a collector current $I_{C203}$ of the transistor Q203.

Bases of the transistors Q201 and Q204 are coupled together. Bases of the transistors Q202 and Q203 are coupled together. A differential input voltage $V_i$ is applied across the coupled bases of the transistors Q201 and Q204 and the coupled bases of the transistors Q202 and Q203.

Collectors of the transistors Q201 and Q204 are connected to a power supply line applied with a power supply voltage $V_{CC}$. Collectors of the transistors Q202 and Q203 serve as output terminals of the conventional circuit shown in FIG. 3.

Next, the operation of the conventional circuit shown in FIG. 3 is explained below.

Supposing that the base-width modulation (i.e., the Early voltage) is ignored and that the common-base current gain factor of a bipolar transistor is equal to unity, a collector current $I_C$ of a bipolar transistor is typically given as the following expression (11).

$$I_C = I_S \exp\left(\frac{V_{BE}}{V_T}\right) \tag{11}$$

In the expression (11), $V_{BB}$ is a base-to-emitter voltage of the bipolar transistor, and $I_s$ is a saturation current thereof. Also, $V_T$ is the thermal voltage defined as $V_T = kT/q$, where k is the Boltzmann's constant, T is absolute temperature in degrees Kelvin, and q is the charge of an electron.

In the first differential pair, the transistor Q201 is driven by the constant current $I_0$ and the transistor Q202 is driven by the variable current $I_1$ equal to the collector current $I_{C202}$. Therefore, a collector current $I_{C201}$ of the transistor Q201 is expressed as follows, where $V_{BE201}$ is a base-to-emitter voltage of the transistor Q201.

$$I_{C201} = I_S \exp\left(\frac{V_{BE201}}{V_T}\right) = I_0 \tag{12}$$

Accordingly, the collector current $I_{C202}$ of the transistor Q202 is expressed as follows, where $V_{BE202}$ is a base-to-emitter voltage of the transistor Q202.

$$I_{C202} = I_1 = I_S \exp\left(\frac{V_{BE202}}{V_T}\right) \tag{13}$$
$$= I_S \exp\left(\frac{V_{BE201} - V_i}{V_T}\right)$$
$$= I_0 \exp\left(-\frac{V_i}{V_T}\right)$$

It is seen that the equation (13) is in a same form as that of the equation (11), in which the saturation current $I_S$ is replaced with the constant current $I_0$ and the base-to-emitter voltage $V_{BE}$ is replaced with the differential input voltage $(-V_i)$. This means that the transistor Q202 serves as a "floating transistor" that operates independent of the power supply voltage $V_{CC}$ and the ground potential.

Similarly, in the second differential pair, the transistor Q204 is driven by the constant current $I_0$ and the transistor Q203 is driven by the variable current $I_2$ equal to the collector current $I_{C203}$. Therefore, a collector current $I_{C204}$ of the transistor Q204 is expressed as follows, where $V_{BE204}$ is a base-to-emitter voltage of the transistor Q204.

$$I_{C204} = I_S \exp\left(\frac{V_{BE204}}{V_T}\right) = I_0 \tag{14}$$

Accordingly, the collector current $I_{C203}$ of the transistor Q203 is expressed as follows, where $V_{BE203}$ is a base-to-emitter voltage of the transistor Q203.

$$I_{C203} = I_2 = I_S \exp\left(\frac{V_{BE203}}{V_T}\right) \tag{15}$$
$$= I_S \exp\left(\frac{V_i - V_{BE204}}{V_T}\right)$$
$$= I_0 \exp\left(\frac{V_i}{V_T}\right)$$

It is seen that the equation (15) also is in a same form as that of the equation (11), in which the saturation current $I_S$ is replaced with the constant current $I_D$ and the base-to-emitter voltage $V_{BE}$ is replaced with the differential input voltage $V_i$. This means that the transistor Q203 serves as a "floating transistor" that operates independent of the power supply voltage $V_{CC}$ and the ground potential.

If the sum of the collector currents $I_{C202}$ and $I_{C203}$ is defined as $I^+$ and the difference between the collector currents $I_{C202}$ and $I_{C203}$ is defined as $I^-$, the sum and difference currents $I^+$ and $I^-$ are given by the following equations (16) and (17), respectively.

$$I^+ = I_{C2} + I_{C3} \tag{16}$$
$$= I_0 \exp\left(-\frac{V_i}{V_T}\right) + I_0 \exp\left(\frac{V_i}{V_T}\right)$$
$$= 2I_0 \cosh\left(\frac{V_i}{V_T}\right)$$

$$I^- = I_{C3} - I_{C2} \tag{17}$$
$$= I_0 \exp\left(\frac{V_i}{V_T}\right) - I_0 \exp\left(-\frac{V_i}{V_T}\right)$$
$$= 2I_0 \sinh\left(\frac{V_i}{V_T}\right)$$

As clearly seen from the equations (16) and (17), the sum current $I^+$ is proportional to a hyperbolic cosine (cosh) of the differential input voltage $V_i$, and the difference current $I^-$ is proportional to a hyperbolic sine (sinh) of the differential input voltage $V_i$.

In other words, if the sum current $I^+$ is used as an output of the conventional circuit shown in FIG. 3, a hyperbolic cosine circuit is realized. If the difference current $I^-$ is used as an output of the conventional circuit shown in FIG. 3, a hyperbolic sine circuit is realized.

With the conventional circuit shown in FIG. 3, a bootstrap operation is realized by using the two current mirror subcircuits 203 and 204. Therefore, there is a problem that unignorable error will occur if the mirror ratios of the current mirror subcircuits 203 and 204 are different from each other.

An OTA and a squarer are essential, basic function blocks in analog signal applications. In recent years, there has been the strong need of realizing the transconductance linearity of an OTA and of realizing the square-law characteristic of a squarer within a practically wide input voltage range.

Also, to perform signal processes used in the neural computing or neural networks by analog circuits, hyperbolic cosine (cosh) and hyperbolic sine (sinh) circuits are necessary.

SUMMARY OF THE INVENTION

Accordingly, an object of the present invention is to provide an OTA having completely linear transconductance characteristic within a practically wide input voltage range with a simple circuit configuration.

Another object of the present invention is to provide a squarer having an accurate square-law characteristic within a practically wide input voltage range with a simple circuit configuration.

Still another object of the present invention is to provide hyperbolic cosine and hyperbolic sine circuits having an accurate hyperbolic cosine or hyperbolic sine characteristic.

A further object of the present invention is to provide an OTA, a squarer, and hyperbolic cosine and hyperbolic sine circuits that are readily formed on an IC.

The above objects together with others not specifically mentioned will become clear to those skilled in the art from the following description.

According to a first aspect of the present invention, an OTA is provided, which is comprised of a first differential circuit and a second differential circuit.

The first differential circuit has a first differential pair of first and second MOSFETs whose sources are coupled together and a third MOSFET serving as a bypass transistor for the first differential pair. The first differential pair is driven by a first constant tail current. The second MOSFET is driven by a first constant driving current.

The second differential circuit has a second differential pair of fourth and fifth MOSFETs whose sources are coupled together and a sixth MOSFET serving as a bypass transistor for the second differential pair. The second differential pair is driven by a second constant tail current. The fifth MOSFET is driven by a second constant driving current.

A differential input voltage is applied across gates of the first and second MOSFETs and across gates of the fifth and fourth MOSFETs.

A difference of a drain current of the first MOSFET and a drain current of the fourth MOSFET includes a component proportional to the differential input voltage.

With the OTA according to the first aspect of the present invention, the second MOSFET of the first differential pair is driven by the first constant driving current in the first differential circuit. Therefore, a gate-to-source voltage of the second MOSFET is fixed at a specific value according to the first constant driving current.

On the other hand, a gate-to-source voltage of the first MOSFET is equal to a difference between the differential input voltage and the gate-to-source voltage of the second MOSFET.

Accordingly, the gate-to-source voltage of the first MOSFET varies according to the differential input voltage. This means that a drain current of the first MOSFET varies according to the square of the differential input voltage due to the square-law characteristic of the first MOSFET.

In the second differential circuit, in the same way as above, a gate-to-source voltage of the fourth MOSFET varies according to the differential input voltage. As a result, a drain current of the fourth MOSFET varies according to the square of the differential input voltage.

Consequently, the difference of the drain currents of the first and fourth MOSFETs includes a component proportional to the differential input voltage, which realizes a completely linear transconductance characteristic.

The operable input range of the OTA according to the first aspect is restricted by only the bypass currents flowing through the third and sixth MOSFETs serving as the bypass transistors, respectively. Therefore, a practically wide input voltage range is ensured.

The OTA according to the first aspect is comprised of the first differential circuit including first, second, and third MOSFETs and the second differential circuit including forth, fifth, and sixth MOSFETs and therefore, it is formed by a simple circuit configuration.

According to a second aspect of the present invention, a squarer is provided. This squarer is comprised of the same configuration as that of the OTA according to the first aspect except that a sum of the drain currents of the first and fourth MOSFETs is used as an output. The sum of the drain currents of the first and second MOSFETs includes a component proportional to a square of the differential input voltage.

With the squarer according to the second aspect of the present invention, because of the same reason as that of the OTA according to the first aspect, an accurate square-law characteristic is realized within a practically wide input voltage range with a simple circuit configuration.

According to a third aspect of the present invention, another squarer is provided.

The squarer according to the third aspect is comprised of a differential pair of first and second MOSFETs whose sources are coupled together, a third MOSFET whose source is connected to the coupled sources of the first and second MOSFETs, and a fourth MOSFET serving as a bypass transistor for the differential pair.

The differential pair is driven by a constant tail current. The third MOSFET is driven by a constant driving current.

Gates of the first and third MOSFETs are coupled together through a first resistor. Gates of the second and third MOSFETs are coupled together through a second resistor having a same resistance as that of the first resistor.

A differential input voltage is applied across the gates of the first and second MOSFETs.

A sum of a drain current of the first MOSFET and a drain current of the second MOSFET includes a component proportional to a square of the differential input voltage.

With the squarer according to the third aspect, the middle-point voltage of the two voltages at the gates of the first and second MOSFETs is simply produced by the first and second resistors. Thus there is an additional advantage that the circuit configuration is simpler than the squarer according to the second aspect.

In a preferred embodiment of the squarer according to the third aspect, the bypass current flowing through the fourth MOSFET is derived as another output current of the squarer. There is an additional advantage that two output currents are simultaneously obtained.

According to a fourth aspect of the present invention, a hyperbolic cosine (cosh) circuit is provided, which is comprised of a first differential circuit and a second differential circuit.

The hyperbolic cosine circuit according to the fourth aspect corresponds to a circuit obtained by replacing respectively the first to sixth MOSFETs in the squarer according to the second aspect with first to sixth bipolar transistors.

Specifically, the first differential circuit has a first differential pair of first and second bipolar transistors whose emitters are coupled together and a third bipolar transistor serving as a bypass transistor for the first differential pair. The first differential pair is driven by a first constant tail current. The second bipolar transistor is driven by a first constant driving current.

The second differential circuit has a second differential pair of fourth and fifth bipolar transistors whose emitters are coupled together and a sixth bipolar transistor serving as a bypass transistor for the second differential pair. The second differential pair is driven by a second constant tail current. The fifth bipolar transistor is driven by a second constant driving current.

A differential input voltage is applied across bases of the first and second bipolar transistors and across bases of the fifth and fourth bipolar transistors.

A sum of a collector current of the first bipolar transistor and a collector current of the fourth bipolar transistor includes a component proportional to a hyperbolic cosine of the differential input voltage.

With the hyperbolic cosine (cosh) circuit according to the fourth aspect of the present invention, the second bipolar transistor of the first differential pair is driven by the first constant driving current in the first differential circuit. Therefore, a base-to-emitter voltage of the second bipolar transistor is fixed at a specific value according to the first constant driving current.

On the other hand, a base-to-emitter voltage of the first bipolar transistor is equal to a difference between the differential input voltage and the base-to-emitter voltage of the second bipolar transistor.

Accordingly, the base-to-emitter voltage of the first bipolar transistor varies according to the differential input voltage. This means that a collector current of the first bipolar transistor varies according to an exponent of the differential input voltage due to the exponential-law characteristic of the first bipolar transistor.

In the second differential circuit, in the same way as above, a base-to-emitter voltage of the fourth bipolar transistor varies according to the differential input voltage. As a result, a collector current of the fourth bipolar transistor varies according to an exponent of the differential input voltage.

Consequently, the sum of the collector currents of the first and fourth bipolar transistors includes a component proportional to a hyperbolic cosine (cosh) of the differential input voltage, which realizes an accurate hyperbolic cosine function.

The operable input range of the hyperbolic cosine circuit according to the fourth aspect is restricted by only the bypass currents flowing through the third and sixth bipolar transistors serving as the bypass transistors, respectively. Therefore, a practically wide input voltage range is ensured.

As described above, an accurate hyperbolic cosine characteristic is realized within a practically wide input voltage range with a simple circuit configuration.

Since the hyperbolic cosine circuit according to the fourth aspect is comprised of the first differential circuit including first, second, and third bipolar transistors and the second differential circuit including forth, fifth, and sixth bipolar transistors, it is formed by a simple circuit configuration.

According to a fifth aspect of the present invention, a hyperbolic sine (sinh) circuit is provided, which is comprised of the same configuration as that of the hyperbolic cosine (cosh) circuit according to the fourth aspect except that a difference of the collector currents of the first and fourth bipolar transistors is used as an output. The difference of the collector currents of the first and fourth bipolar transistors includes a component proportional to a hyperbolic sine (sinh) of the differential input voltage.

With the hyperbolic sine (sinh) circuit according to the fifth aspect of the present invention, because of the same reason as that of the hyperbolic cosine circuit according to the fourth aspect, an accurate hyperbolic sine characteristic is realized within a practically wide input voltage range with a simple circuit configuration.

According to a sixth aspect of the present invention, another hyperbolic cosine (cosh) circuit is provided, which corresponds to a circuit obtained by replacing respectively the first to fourth MOSFETs in the squarer according to the third aspect with first to fourth bipolar transistors.

Specifically, the hyperbolic cosine circuit according to the sixth aspect is comprised of a differential pair of first and second bipolar transistors whose emitters are coupled together, a third bipolar transistor whose emitter is connected to the coupled emitters of the first and second bipolar transistor, and a fourth bipolar transistor serving as a bypass transistor for the differential pair.

The differential pair is driven by a constant tail current. The third bipolar transistor is driven by a constant driving current.

Bases of the first and third bipolar transistors are coupled together through a first resistor. Bases of the second and third bipolar transistors are coupled together through a second resistor having a same resistance as that of the first resistor.

A differential input voltage is applied across the bases of the first and second bipolar transistor.

A sum of a collector current of the first bipolar transistor and a collector current of the second bipolar transistor includes a component proportional to a hyperbolic cosine (cosh) of the differential input voltage.

With the hyperbolic cosine (cosh) circuit according to the sixth aspect, the middle-point voltage of the two voltages at the bases of the first and second bipolar transistors is simply produced by the first and second resistors. Thus, there is an additional advantage that the circuit configuration is simpler than the hyperbolic cosine circuit according to the fourth aspect.

According to a seventh aspect of the present invention, another hyperbolic sine (sinh) circuit is provided, which is comprised of the same configuration as that of the hyperbolic cosine (cosh) circuit according to the sixth aspect except that a difference of the collector currents of the first and second bipolar transistors is used as an output. The difference of the collector currents of the first and second bipolar transistors includes a component proportional to a hyperbolic sine (sinh) of the differential input voltage.

With the hyperbolic sine (sinh) circuit according to the seventh aspect, the middle-point voltage of the two voltages at the bases of the first and second bipolar transistors is simply produced by the first and second resistors. Thus, there is an additional advantage that the circuit configuration is simpler than the hyperbolic sine circuit according to the fifth aspect.

BRIEF DESCRIPTION OF THE DRAWINGS

In order that the present invention may be readily carried into effect, it will now be described with reference to the accompanying drawings.

FIG. 3 is a circuit diagram of a basic configuration of conventional bipolar hyperbolic cosine (cosh) and hyperbolic sine (sinh) circuits.

FIG. 8A is a circuit diagram of a bipolar hyperbolic cosine (cosh) circuit according to a fourth embodiment of the present invention.

DETAILED DESCRIPTION OF THE PREFERRED EMBODIMENTS

Figure 1:
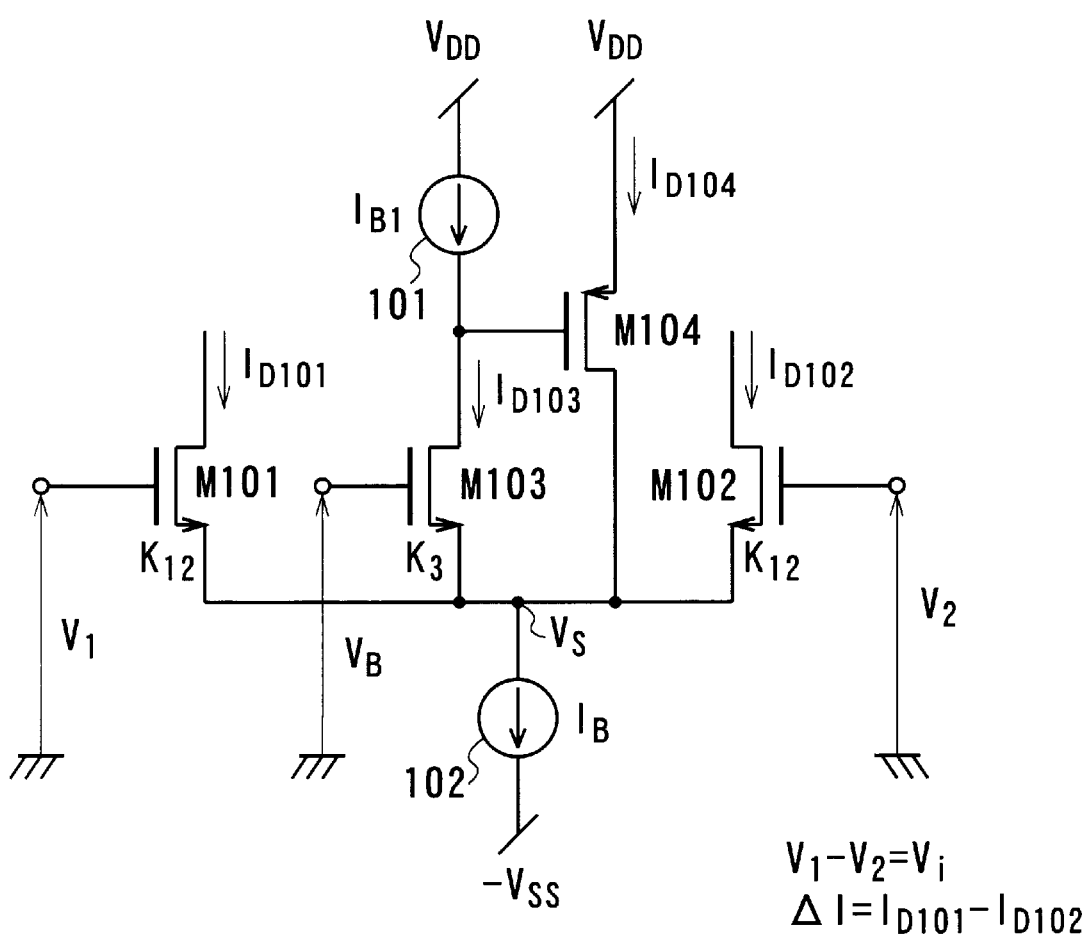
FIG. 1 is a circuit diagram of a conventional CMOS OTA.

Preferred embodiments of the present invention will be described in detail below while referring to the drawings attached.

First Embodiment

Figure 4A:
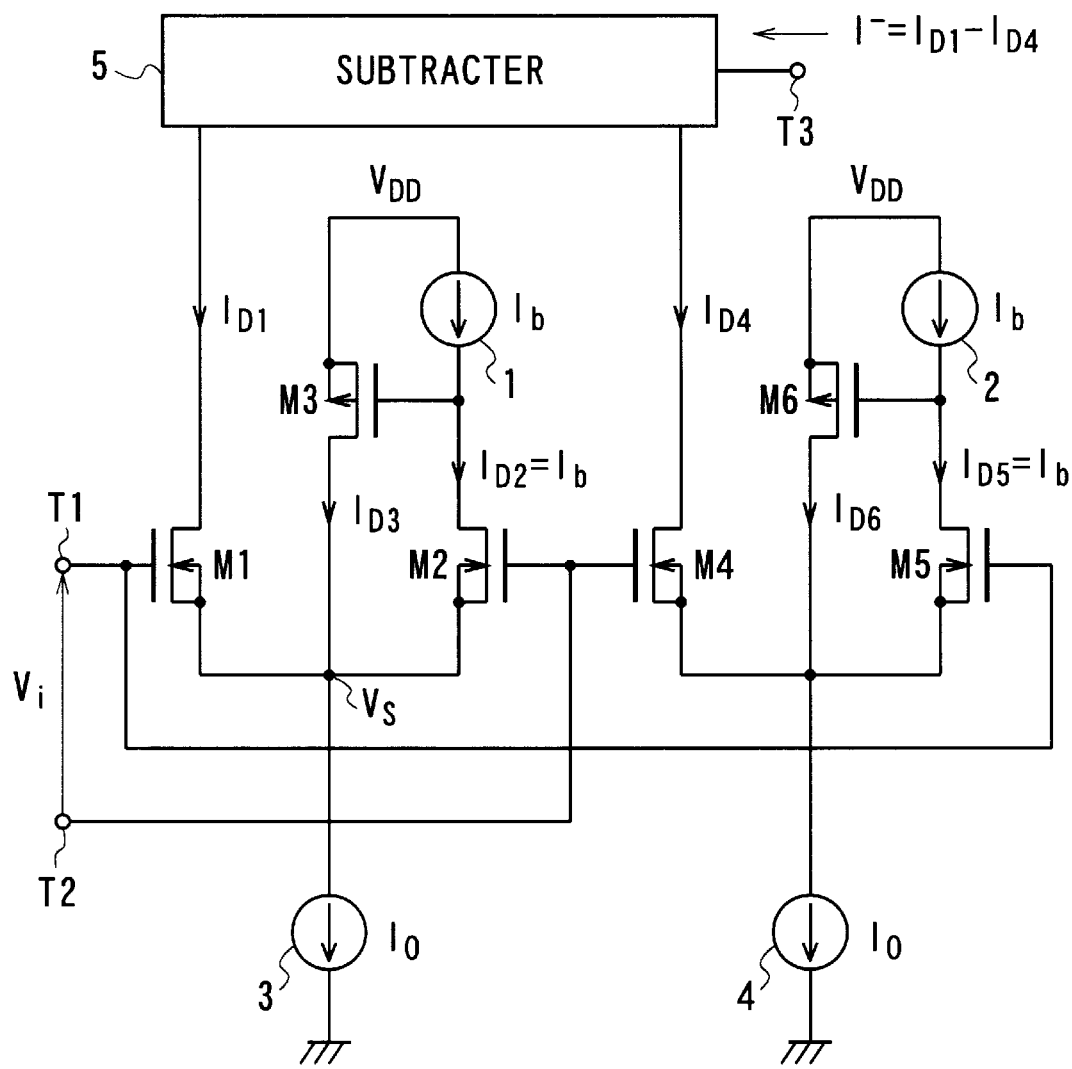
FIG. 4A is a circuit diagram of a CMOS OTA according to a first embodiment of the present invention.

A CMOS OTA according to a first embodiment of the present invention is shown in FIG. 4A.

As shown in FIG. 4A, this CMOS OTA is comprised of a first differential circuit and a second differential circuit.

The first differential circuit has a first balanced differential pair of source-coupled n-channel MOSFETs M1 and M2, a constant current source 1 for supplying a constant driving current $I_b$, and a p-channel MOSFET M3 whose drain is connected to the coupled sources of the MOSFETs M1 and M2. The transconductance parameters $\beta$ of the MOSFETs M1, M2, and M3 are equal to each other.

The coupled sources of the MOSFETs M1 and M2 are connected to a terminal of a constant current sink 3 sinking a constant current $I_0$. Another terminal of the constant current sink 3 is connected to the ground. The first differential pair of the MOSFETs $M_1$ and M2 is driven by the constant current $I_0$. The constant current $I_0$ may be termed a tail current of the first differential pair.

Gates of the MOSFETs M1 and M2 are connected to input terminals T1 and T2, respectively. A differential input voltage $V_i$ is applied across the gates of the MOSFETs M1 and M2 through the input terminals T1 and T2.

A gate of the MOSFET M3 is connected to a drain of the MOSFET M2. The gate of the MOSFET M3 and the drain of the MOSFET M2 are further connected to a terminal of the constant current source 1. Another terminal of the constant current source 1 is connected to a power supply line (not shown) applied with a power supply voltage $V_{DD}$. A source of the MOSFET M3 is connected to the power supply line of $V_{DD}$.

The MOSFET M2 is driven by the constant driving current $I_b$ produced by the constant current source 1. The MOSFET M3 serves as a bypass transistor allowing a part of the constant tail current $I_0$ to flow as a bypass current of the first differential pair.

Similarly, the second differential circuit has a second balanced differential pair of source-coupled n-channel MOSFETs M4 and M5, a constant current source 2 for supplying a same constant driving current $I_b$ as the constant current source 1, and a p-channel MOSFET M6 whose drain is connected to the coupled sources of the MOSFETs M4 and M5. The transconductance parameters $\beta$ of the MOSFETs M4, M5, and M6 are equal to those of the MOSFETs M1, M2, and M3.

The coupled sources of the MOSFETs M4 and M5 are connected to a terminal of a constant current sink 4 sinking a same constant current $I_0$ as the constant current sink 3. Another terminal of the constant current sink 4 is connected to the ground. The second differential pair of the MOSFETs M4 and M5 is driven by the constant current $I_0$. The constant current $I_0$ may be termed a tail current of the second differential pair.

Gates of the MOSFETs M4 and M5 are connected to the input terminals T2 and T1, respectively. The differential input voltage $V_i$ is applied across the gates of the MOSFETs M4 and M5 through the input terminals T2 and T1 in an opposite phase to the MOSFETs M1 and M2.

A gate of the MOSFET M6 is connected to a drain of the MOSEET M5. The gate of the MOSFET M6 and the drain of the MOSFET M5 are further connected to a terminal of the constant current source 2. Another terminal of the constant current source 2 is connected to the power supply line of $V_{DD}$. A source of the MOSFET M6 is connected to the power supply line of $V_{DD}$.

The MOSFET M5 is driven by the constant driving current $I_b$ produced by the constant current source 2. The MOSFET M6 serves as a bypass transistor allowing a part of the constant tail current $I_0$ to flow as a bypass current of the second differential pair.

The drains of the MOSFETs M1 and M4 are connected to a subtracter 5, thereby producing an output current $I^-$ of the OTA at an output terminal T3.

Next, the operation of the CMOS OTA according to the first embodiment shown in FIG. 4A is explained below.

When the differential input voltage $V_i$ is applied across the gates of the MOSFETs M1 and M2 of the first balanced differential pair, the following relationship (18) is established around the loop consisting of the input voltage $V_i$ and the two gate-source junctions of the MOSFETs M1 and M2 according to the Kirchhoff's voltage law.

$$V_i = V_{GS1} - V_{GS2} \tag{18}$$

In the relationship (18), $V_{GS1}$ and $V_{GS2}$ are gate-to-source voltages of the MOSFETs M1 and M2, respectively.

Therefore, using the previously-explained equation (1) and the relationship (18), a drain current $I_{D1}$ of the MOSEST M1 is given as the following equation (19).

$$I_{D1} = \beta(V_{GS1} - V_{TH})^2 \tag{19}$$

-continued $$= \beta(V_i + V_{GS2} - V_{TH})^2$$

A drain current $I_{D2}$ of the MOSFET M2 is given by the following equation (20).

$$I_{D2} = \beta(V_{GS2} - V_{TH})^2 = I_b \quad (20)$$

On the other hand, a drain current of the MOSFET M3 is defined as $I_{D3}$, the drain current $I_{D3}$ has the following relationship (21) with the drain currents $I_{D1}$ ad $I_{D2}$ of the MOSFETs M1 and M2.

$$I_{D1} + I_{D2} + I_{D3} = I_0 \quad (21)$$

Therefore, the equation (19) is rewritten to the following equation (22) using the equation (20).

$$I_{D1} = \beta\{V_i + (V_{GS2} - V_{TH})\}^2 \quad (22)$$

$$= \beta\left\{V_i + \sqrt{\frac{I_b}{\beta}}\right\}^2$$

$$= \beta V_i^2 + 2\beta V_i \sqrt{\frac{I_b}{\beta}} + I_b$$

Similarly, the drain current $I_{D3}$ of the MOSFET M3 is given by the following equation (23) using the equations (22) and (20).

$$I_{D3} = I_0 - I_{D1} - I_{D2} \quad (23)$$

$$= I_0 - \left(\beta V_i^2 + 2\beta V_i \sqrt{\frac{I_b}{\beta}} + I_b\right) - I_b$$

$$= I_0 - \beta V_i^2 - 2\beta V_i \sqrt{\frac{I_b}{\beta}} - 2I_b$$

Due to the condition that the drain current $I_{D3}$ is greater than or equal to zero, i.e., $I_{D3} \geq 0$, the operable range of the differential input voltage $V_i$ is given as the following expression (24), which is obtained by setting the value of $I_{D3}$ is zero or greater in the equation (23).

$$-\sqrt{\frac{I_b}{\beta}} - \sqrt{\frac{I_0 - I_b}{\beta}} \leq V_i \leq -\sqrt{\frac{I_b}{\beta}} + \sqrt{\frac{I_0 - I_b}{\beta}} \quad (24)$$

In the second differential circuit, the differential input voltage $V_i$ is applied across the gates of the MOSFETs M4 and M5 of the second balanced differential pair in an opposite phase to the first differential pair. Therefore, a drain current $I_{D4}$ of the MOSFET M4 is given by the following equation (25) in the same way as that of the first differential pair.

$$I_{D4} = \beta V_i^2 - 2\beta V_i \sqrt{\frac{I_b}{\beta}} + I_b \quad (25)$$

$$= \beta\left\{V_i - \sqrt{\frac{I_b}{\beta}}\right\}^2$$

Due to the condition that the drain current $I_{D6}$ is greater than or equal to zero, i.e., $I_{D6} \geq 0$, the operable range of the differential input voltage $V_i$ is given as the following expression (26) in the same way as that of the first differential pair.

$$\sqrt{\frac{I_b}{\beta}} - \sqrt{\frac{I_0 - I_b}{\beta}} \leq V_i \leq \sqrt{\frac{I_b}{\beta}} + \sqrt{\frac{I_0 - I_b}{\beta}} \quad (26)$$

The output current $I^-$ of the OTA, which is produced by the subtracter 5 at the output terminal T3, is equal to the difference between the drain currents $I_{D1}$ and $I_{D4}$, i.e., $I^- = I_{D1} - I_{D4}$. Therefore, the output current $I^-$ is given by the following equation (27).

$$I^- = I_{D1} - I_{D4} = 4V_i \sqrt{\frac{I_b}{\beta}} \quad (27)$$

The equation (27) is established under the condition of the following expression (28), which is given by the expressions (24) and (26).

$$|V_i| \leq \sqrt{\frac{I_b}{\beta}} \quad (28)$$

As clearly seen from the equation (27), the output current $I^-$ is accurately proportional to the applied differential input voltage $V_i$. This means that the circuit configuration shown in FIG. 4A realizes an OTA function.

Figure 5:
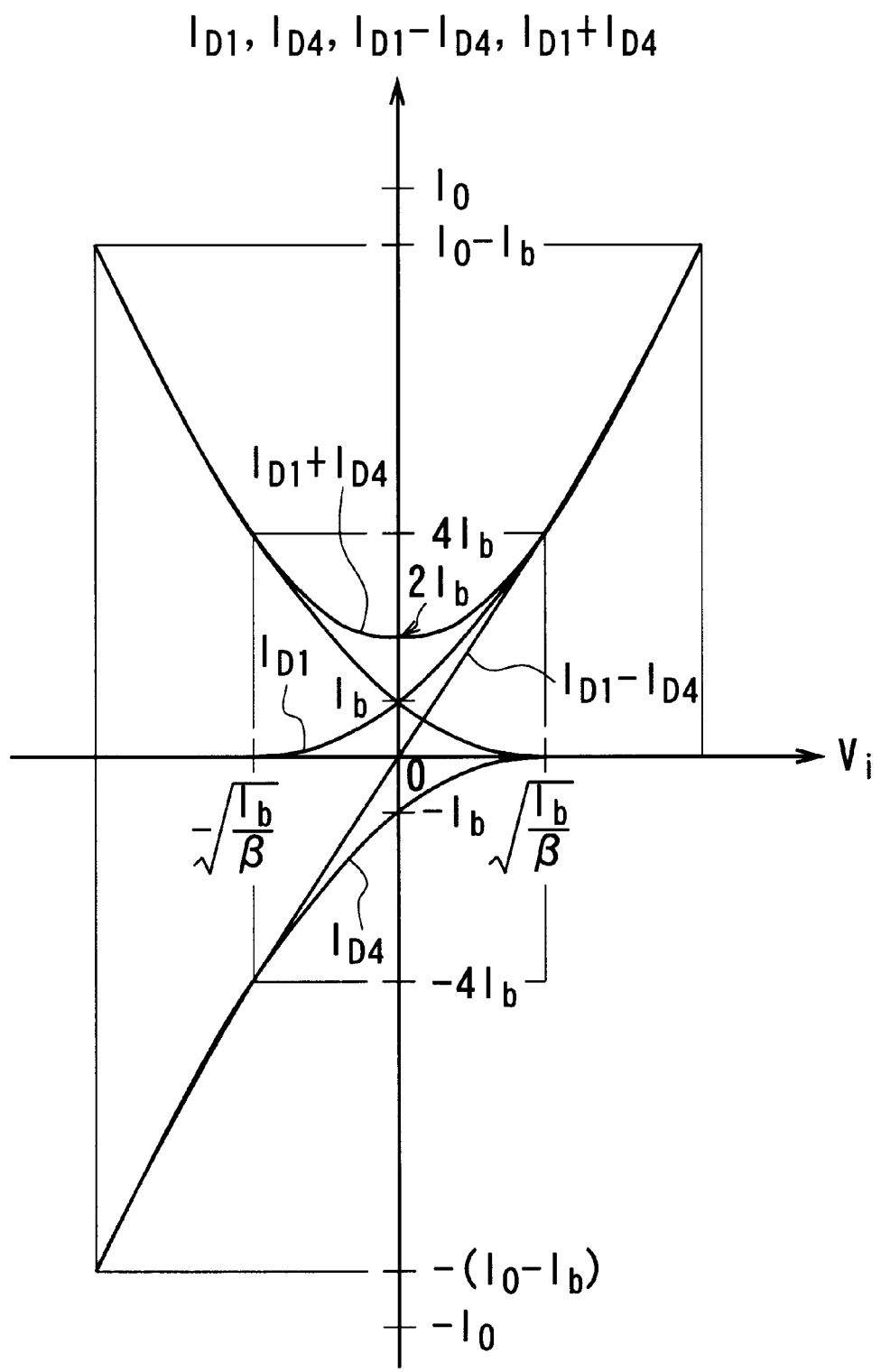
FIG. 5 is a graph showing the transfer characteristics of the CMOS OTA and the CMOS squarer according to the first and second embodiments of FIGS. 4A and 4B.

FIG. 5 shows the transfer characteristics of the CMOS OTA according to the first embodiment. It is seen from FIG. 5 that the drain currents $I_{D1}$ and $I_{D4}$ of the MOSFETs M1 and M4 have square-law characteristics with respect to the differential input voltage $V_i$, and that the output current $I^-(=I_{D1}-I_{D4})$ has a linear characteristic with respect to the differential input voltage $V_i$.

With the CMOS OTA according to the first embodiment of the present invention shown in FIG. 4A, as described above, the MOSFET M2 of the first differential pair is driven by the constant driving current $I_b$ in the first differential circuit. Therefore, the gate-to-source voltage $V_{GS2}$ of the MOSFET M2 is fixed at a specific value according to the constant driving current $I_b$.

On the other hand, the gate-to-source voltage $V_{GS1}$ of the MOSFET M1 is equal to a difference between the differential input voltage $V_i$ and the gate-to-source voltage $V_{GS2}$ of the MOSFET M2, as seen from the equation (18). This means that the MOSFET M1 serves as a "floating transistor".

Accordingly, the gate-to-source voltage $V_{GS1}$ of the MOSFET M1 varies according to the differential input voltage $V_i$, which means that the drain current $I_{D1}$ of the MOSFET M1 varies according to the square of the differential input voltage $V_i$ due to the square-law characteristic of the MOSFET M1.

In the second differential circuit, in the same way as that of the first differential circuit, the gate-to-source voltage $V_{GS4}$ of the MOSFET M4 varies according to the differential input voltage $V_i$. This means that the MOSFET M4 serves as a "floating transistor". As a result, the drain current $I_{D4}$ of the MOSFET M4 varies according to the square of the differential input voltage $V_i$.

Consequently, the difference of the drain currents $I_{D1}$ and $I_{D4}$ of the MOSFETs M1 and M4 is proportional to the differential input voltage $V_i$, which means that an OTA function is realized.

The operable input range of the OTA according to the first embodiment is restricted by only the drain currents $I_{D3}$ and $I_{D6}$ of the MOSFETs M3 and M6 serving as bypass currents, respectively. Therefore, a practically wide voltage range of the differential input voltage $V_i$ is ensured.

As described above, a completely linear transconductance characteristic is realized within a practically wide input voltage range with a simple circuit configuration.

Second Embodiment

Figure 4B:
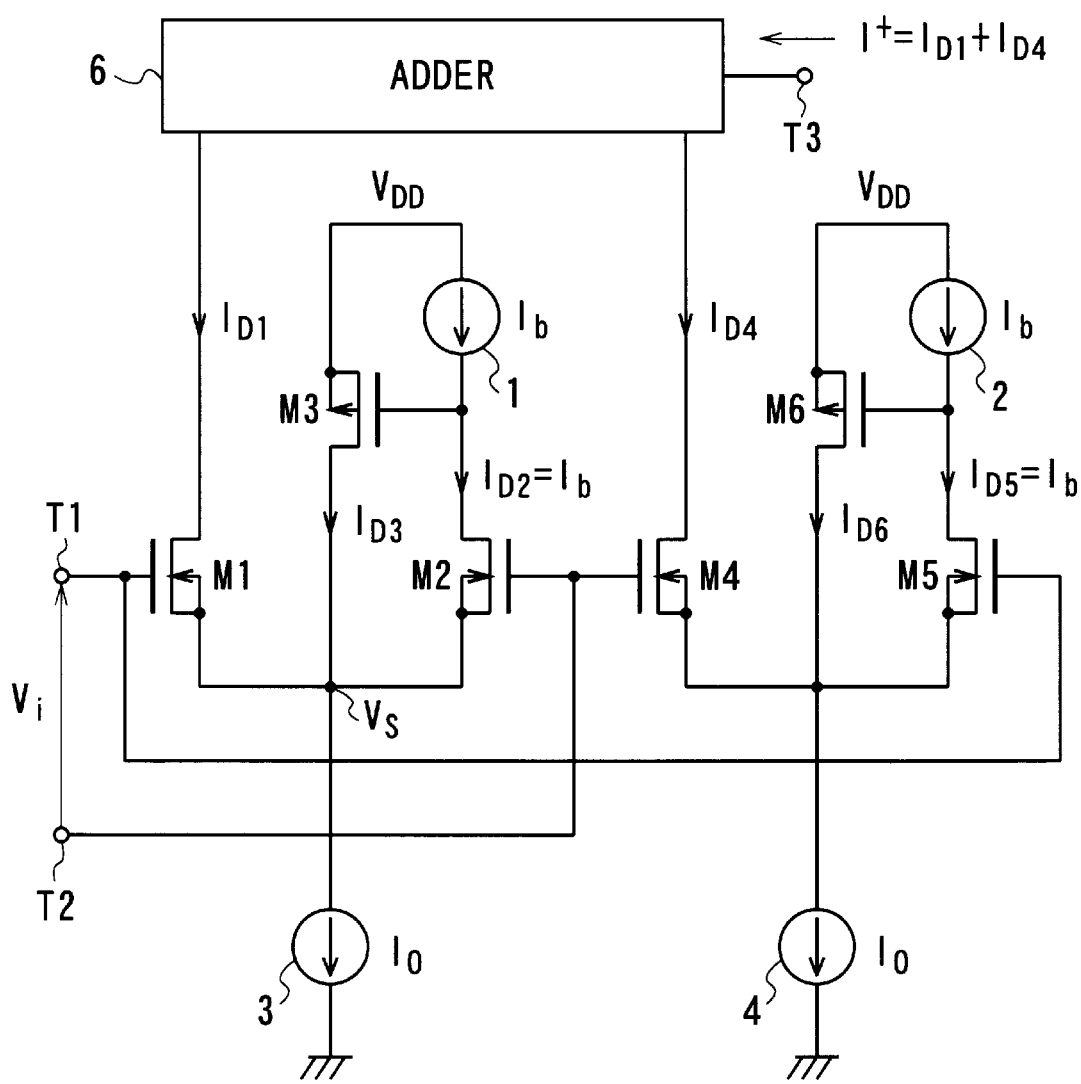
FIG. 4B is a circuit diagram of a CMOS squarer according to a second embodiment of the present invention.

FIG. 4B shows a CMOS squarer according to a second embodiment of the present invention.

As shown in FIG. 4B, this CMOS squarer has the same circuit configuration as that of the CMOS OTA according to the first embodiment except that an adder 6 is provided instead of the subtracter 5 in the first embodiment. Therefore, explanation about the same configuration as that of the first embodiment is omitted here by attaching the same reference symbols as those of the first embodiment in FIG. 4B for the sake of simplification of description.

In this squarer, an output current $I^+$, which is produced by the adder 6 at the output terminal T3, is equal to the sum of the drain currents $I_{D1}$ and $I_{D4}$ of the MOSFETs M1 and M4, i.e., $I^+=I_{D1}+I_{D4}$. Therefore, the output current $I^+$ is given by the following equation (29).

$$I^+ = I_{D1} + I_{D4} = 2(\beta V_i^2 + I_b) \tag{29}$$

As clearly seen from the equation (29), the sum of the drain currents $I_{D1}$ and $I_{D4}$ of the MOSFETs M1 and M4 includes a component proportional to the square of the differential input voltage $V_i$, (i.e., $V_i^2$). This means that a squarer function is realized.

FIG. 5 shows the transfer characteristic of the CMOS squarer according to the second embodiment. It is seen from FIG. 5 that the output current $I^+(=I_{D1}+I_{D4})$ has an accurate square-law characteristic with respect to the differential input voltage $V_i$.

The operable input voltage range is equal to that of the OTA according to the first embodiment as shown by the above expression (28). Since the operable input range of the squarer according to the second embodiment is equal to that of the OTA according to the first embodiment, a practically wide range of the differential input voltage $V_i$ is ensured.

Thus, an accurate square-law characteristic is realized within a practically wide input voltage range with a simple circuit configuration in the squarer according to the second embodiment.

Third Embodiment

Figure 6:
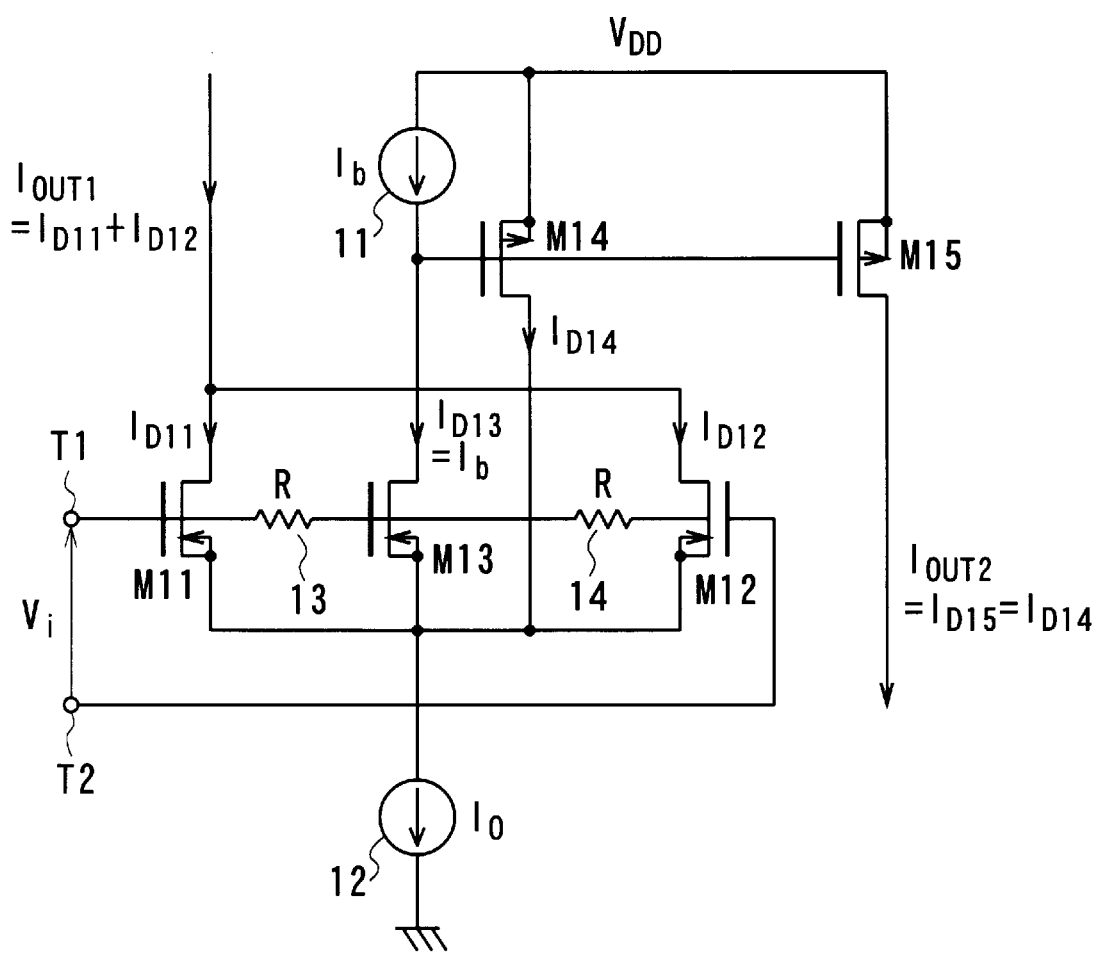
FIG. 6 is a circuit diagram of a CMOS squarer according to a third embodiment of the present invention.

FIG. 6 shows a CMOS squarer according to a third embodiment of the present invention.

As shown in FIG. 6, this CMOS squarer is comprised of a single differential circuit, which is unlike the squarer according to the second embodiment of FIG. 4B.

The differential circuit has a balanced differential pair of source-coupled n-channel MOSFETs M11 and M12, an n-channel MOSFET M13 whose source is connected to the coupled sources of the MOSFETs M11 and M12, a constant current source 11 for supplying a constant driving current $I_b$, and a p-channel MOSFET M14 whose drain is connected to the coupled sources of the MOSFETs M11, M12, and M13. The transconductance parameters $\beta$ of the MOSFETs M11, M12, M13, and M14 are equal to each other.

The coupled sources of the MOSFETs M11, M12, and M13 are connected to a terminal of a constant current sink 12 sinking a constant current $I_0$. Another terminal of the constant current sink 12 is connected to the ground. The differential pair of the MOSFETs M11 and M12 is driven by the constant current $I_0$. The constant current $I_0$ may be termed a tail current of the differential pair.

Gates of the MOSFETs M11 and M12 are connected to input terminals T1 and T2, respectively. A differential input voltage $V_i$ is applied across the gates of the MOSFETs M11 and M12 through the input terminals T1 and T2.

A gate of the MOSFET M13 is connected to the gate of the MOSFET M11 through a resistor 13 with a resistance R and to the gate of the MOSFET M12 through a resistor 14 with a same resistance R as the resistor 13. Therefore, the gate of the MOSFET M13 is applied with a half of the applied differential input voltage $V_i$, i.e., ($V_i/2$).

A drain of the MOSFET M13 is connected to a terminal of the constant current source 11. Another terminal of the constant current source 11 is connected to a power supply line (not shown) applied with a power supply voltage $V_{DD}$. The MOSFET M13 is driven by the constant driving current $I_b$ produced by the constant current source 11.

A gate of the MOSFET M14 is connected to the drain of the MOSFET M13 and the corresponding terminal of the constant current source 11. A source of the MOSFET M14 is connected to the power supply line of $V_{DD}$. The MOSFET M14 serves as a bypass transistor allowing a part of the constant tail current $I_0$ to flow as a bypass current of the differential pair.

Drains of the MOSFETs M11 and M12 are coupled together. A first output current $I_{OUT1}$ of the squarer is derived from the coupled drains of the MOSFETs M11 and M12.

The CMOS squarer according to the third embodiment is further comprised of a p-channel MOSFET M15 whose gate is connected to the gate of the MOSFET M14 and whose source is connected to the power supply line of $V_{DD}$. The transconductance parameter $\beta$ of the MOSFET M15 is equal to those of the MOSFETs M11, M12, M13, and M14.

The two MOSFETs M14 and M15 constitute a current mirror circuit, thereby producing a second output current $I_{OUT2}$ of the squarer from a drain of the MOSFET M15.

If the second output current $I_{OUT2}$ is not necessary, it is needless to say that the MOSFET 15 may be removed.

Next, the operation of the CMOS squarer according to the third embodiment of FIG. 6 is explained below.

The basic configuration of the CMOS squarer according to the third embodiment is a same as that of the conventional OTA shown in FIG. 1. Accordingly, in the same way as that of the conventional OTA of FIG. 1, drain currents $I_{D11}$, $I_{D12}$, and $I_{D13}$ of the MOSFETs M11, M12, and M13 are given by the following equations (30), (31), and (32), respectively.

$$I_{D11} = \beta \left\{ \frac{V_i}{2} + \sqrt{\frac{I_b}{\beta}} \right\} \tag{30}$$

$$I_{D12} = \beta \left\{ \frac{V_i}{2} - \sqrt{\frac{I_b}{\beta}} \right\} \tag{31}$$

$$I_{D13} = I_b \tag{32}$$

Since the first output current $I_{OUT1}$ is equal to the sum of the drain currents $I_{D11}$ and $I_{D12}$, the first output current $I_{OUT1}$ is expressed as the following equation (33).

$$I_{OUT1} = I_{D1} + I_{D2} = \frac{\beta V_i^2}{2} + 2I_b \quad (33)$$

The operable range of the differential input voltage $V_i$ for the first output current $I_{OUT1}$ is shown in the following expression (28'), which is equal to twice as large as that of the squarer according to the second embodiment of FIG. 4B shown in the expression (28).

$$|V_i| \leq 2\sqrt{\frac{I_b}{\beta}} \quad (28')$$

As clearly seen from the equation (33), the first output current $I_{OUT1}$ is accurately proportional to the square of the applied differential input voltage $V_i$ (i.e., $V_i^2$). This means that the circuit configuration shown in FIG. 6 realizes a squarer function.

The following equation (34) is established between the drain currents $I_{D11}$, $I_{D12}$, $I_{D13}$, and $I_{D14}$ of the MOSFETs M11, M12, M13, and M14.

$$I_{D11} + I_{D12} I_{D13} + I_{D14} = I_0 \quad (34)$$

Therefore, the drain current $I_{D14}$ is given by the following equation (35).

$$\begin{aligned} I_{D14} &= I_0 - (I_{D11} + I_{D12} + I_{D13}) \\ &= I_0 - \left(\frac{\beta V_i^2}{2} + 2I_b + I_b\right) \\ &= I_0 - 3I_b - \frac{\beta V_i^2}{2} = I_{OUT2} \end{aligned} \quad (35)$$

The operable range of the differential input voltage $V_i$ for the drain current $I_{D14}$ is equal to the previously-explained expression (28).

As clearly seen from the equation (35), the drain current $I_{D14}$ of the MOSFET M14 is accurately proportional to the square of the applied differential input voltage $V_i$, i.e., $V_i^2$. In other words, the drain current $I_{D14}$ flows through the MOSFET M14 as a bypass current of the differential pair of the MOSFETs M11 and M12.

Further, since the MOSFETs M14 and M15 constitute the current mirror circuit, a drain current $I_{D15}$ of the MOSFET M15 is equal to the a drain current $I_{D14}$ of the MOSFET M14. On the other hand, the drain current $I_{D15}$ is equal to the second output current $I_{OUT2}$ of this squarer. Accordingly, the second output current $I_{OUT2}$ also is accurately proportional to the square of the applied differential input voltage $V_i$, i.e., $V_i^2$.

Figure 7:
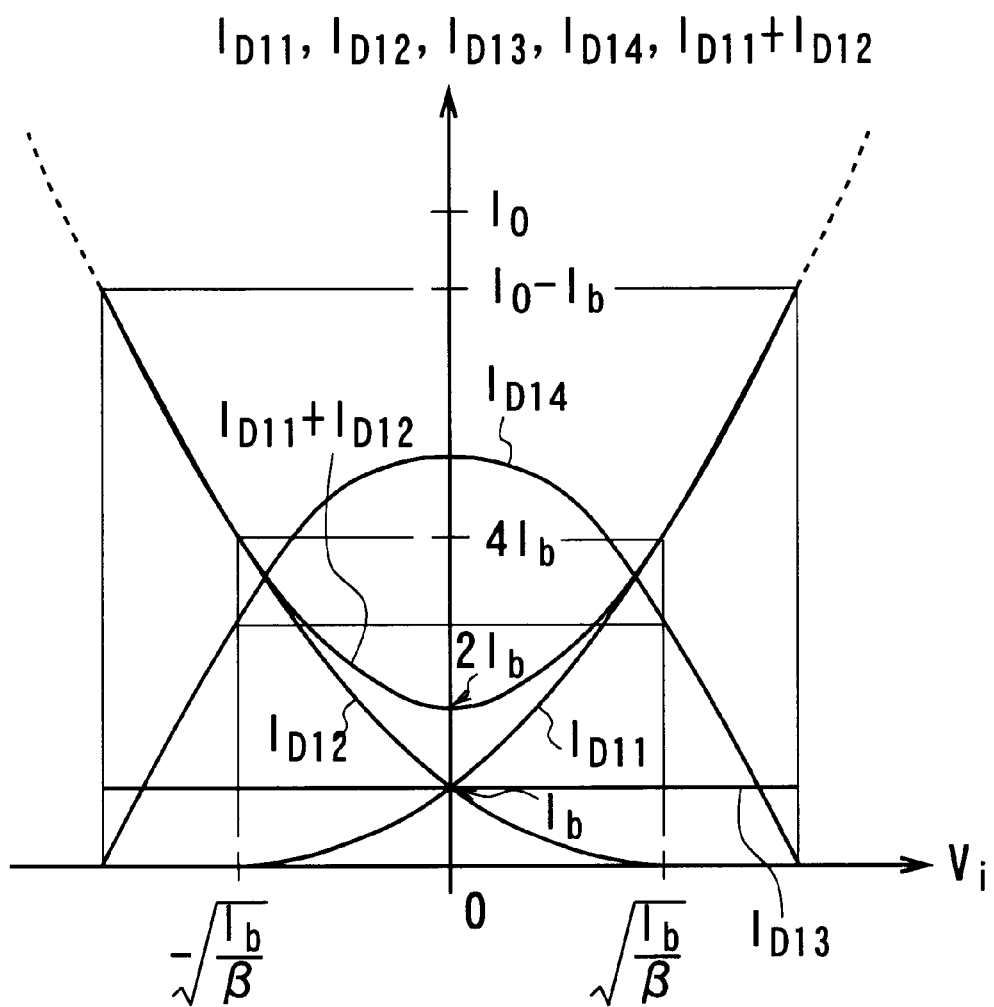
FIG. 7 is a graph showing the transfer characteristics of the CMOS squarer according to the third embodiment of FIG. 6.

FIG. 7 shows the transfer characteristic of the CMOS squarer according to the third embodiment of FIG. 6. It is seen from FIG. 7 that both of the first output current $I_{OUT1}$ (= $I_{D11} + I_{D12}$) and the second output current $I_{OUT2}$ (= $I_{D14} = I_{D15}$) have accurate square-law characteristics with respect to the differential input voltage $V_i$, and that their square-law characteristics are opposite in phase to each other.

As explained above, with the circuit configuration shown in FIG. 6, a squarer function producing the two output currents $I_{OUT1}$, and $I_{OUT2}$ is realized.

Figure 2:
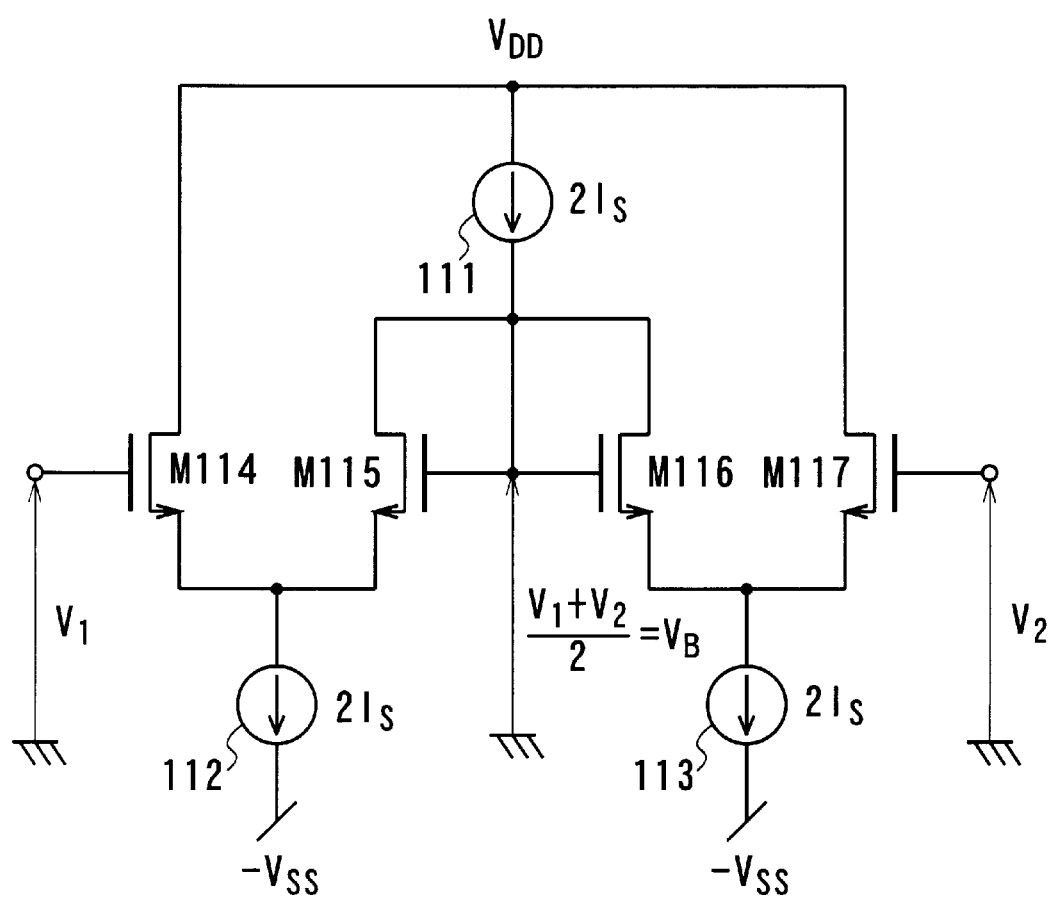
FIG. 2 is a circuit diagram of a voltage divider subcircuit used in the conventional CMOS OTA shown in FIG. 1.

It is obvious that there are the same advantages as those in the second embodiment. Also, there is an additional advantage that the circuit configuration of the squarer according to the third embodiment of FIG. 6 is very simple compared with the conventional circuit configuration shown in FIGS. 1 and 2, because no additional voltage divider circuit shown in FIG. 2 is necessary.

Fourth Embodiment

FIG. 8A shows a bipolar hyperbolic cosine (cosh) circuit according to a fourth embodiment of the present invention. This circuit has a configuration obtained by replacing the MOSFETs M1, M2, M3, M4, M5, and M6 in the CMOS squarer according to the second embodiment of FIG. 4B with bipolar transistors Q1, Q2, Q3, Q4, Q5, and Q6, respectively.

As shown in FIG. 8A, this hyperbolic cosine circuit is comprised of a first differential circuit and a second differential circuit.

The first differential circuit has a first balanced differential pair of emitter-coupled npn-type bipolar transistors Q1 and Q2, a constant current source 1 for supplying a constant driving current $I_b$, and a pnp-type bipolar transistor Q3 whose collector is connected to the coupled emitters of the transistors Q1 and Q2. The emitter areas of the transistors Q1, Q2, and Q3 are equal to each other.

The coupled emitters of the transistors Q1 and Q2 are connected to a terminal of a constant current sink 3 sinking a constant current $I_0$. Another terminal of the constant current sink 3 is connected to the ground. The first differential pair of the transistors Q1 and Q2 is driven by the constant current $I_0$. The constant current $I_0$ may be termed a tail current of the first differential pair.

Bases of the transistors Q1 and Q2 are connected to input terminals T1 and T2, respectively. A differential input voltage $V_i$ is applied across the bases of the transistors Q1 and Q2 through the input terminals T1 and T2.

A base of the transistor Q3 is connected to a collector of the transistor Q2. The base of the transistor Q3 and the collector of the transistor Q2 are further connected to a terminal of the constant current source 1. Another terminal of the constant current source 1 is connected to a power supply line (not shown) applied with a power supply voltage $V_{CC}$. An emitter of the transistor Q3 is connected to the power supply line of $V_{CC}$.

The transistor Q2 is driven by the constant driving current $I_b$ produced by the constant current source 1. The transistor Q3 serves as a bypass current allowing a part of the constant tail current $I_0$ to flow as a bypass current of the first differential pair.

Similarly, the second differential circuit has a second balanced differential pair of emitter-coupled npn-type bipolar transistors Q4 and Q5, a constant current source 2 for supplying a same constant driving current $I_b$ as the constant current source 1, and a pnp-type bipolar transistor Q6 whose collector is connected to the coupled emitters of the transistors Q4 and Q5. The emitter areas of the transistors Q4, Q5, and Q6 are equal to those of the transistors Q1, Q2, and Q3.

The coupled emitters of the transistors Q4 and Q5 are connected to a terminal of a constant current sink 4 sinking a same constant current $I_0$ as the constant current sink 3. Another terminal of the constant current sink 4 is connected to the ground. The second differential pair of the transistors Q4 and Q5 is driven by the constant current $I_0$. The constant current $I_0$ may be termed a tail current of the second differential pair.

Bases of the transistors Q4 and Q5 are connected to the input terminals T2 and T1, respectively. The differential input voltage $V_i$ is applied across the bases of the transistors Q4 and Q5 through the input terminals T1 and T2 in an opposite phase to the transistors Q1 and Q2.

A base of the transistor Q6 is connected to a collector of the transistor Q5. The base of the transistor Q6 and the collector of the transistor Q5 are further connected to a terminal of the constant current source 2. Another terminal of the constant current source 2 is connected to the power supply line of $V_{CC}$. An emitter of the transistor Q6 is connected to the power supply line of $V_{CC}$.

The transistor Q5 is driven by the constant driving current $I_b$ produced by the constant current source 2. The transistor Q6 serves as a bypass transistor allowing a part of the constant tail current $I_0$ to flow as a bypass current of the second differential pair.

The collectors of the transistors Q1 and Q4 are connected to an adder 6, thereby producing an output current $I^+$ of the hyperbolic cosine circuit at an output terminal T3.

The transistors Q1 and Q4 serve as "floating transistors".

Next, the operation of the bipolar hyperbolic cosine circuit according to the fourth embodiment is explained below.

When the differential input voltage $V_i$ is applied across the bases of the transistors Q1 and Q2 of the first balanced differential pair, the following relationship (36) is established around the loop consisting of the input voltage $V_i$ and the two base-emitter junctions of the transistors Q1 and Q2 according to the Kirchhoff's voltage law.

$$V_i = V_{BE1} - V_{BE2} \tag{36}$$

In the relationship (36), $V_{BE1}$ and $V_{BE2}$ are base-to-emitter voltages of the transistors Q1 and Q2, respectively.

Therefore, Using the previously-explained equation (11) and the relationship (36), collector currents $I_{C1}$ and $I_{C2}$ of the transistors Q1 and Q2 are given by the following equations (37) and (38), respectively.

$$I_{C1} = I_S \exp\left(\frac{V_{BE1}}{V_T}\right) = I_S \exp\left(\frac{V_i + V_{BE2}}{V_T}\right) \tag{37}$$

$$I_{C2} = I_S \exp\left(\frac{V_{BE2}}{V_T}\right) = I_b \tag{38}$$

The equation (37) can be rewritten to the following equation (39) using the equation (38).

$$I_{C1} = I_S \exp\left(\frac{V_{BE2}}{V_T}\right) \exp\left(\frac{V_i}{V_T}\right) = I_b \exp\left(\frac{V_i}{V_T}\right) \tag{39}$$

It is seen that the equation (39) is in a same form as that of the equation (11), in which the saturation current $I_S$ is replaced with the constant driving current $I_b$ and the base-to-emitter voltage VBE is replaced with the differential input voltage $V_i$. This means that the transistor Q1 serves as a "floating transistor" that operates independent of the power supply voltage $V_{CC}$ and the ground potential.

The differential input voltage $V_i$ is applied across the bases of the transistors Q4 and Q5 of the second balanced differential pair in an opposite phase to the first differential pair. Therefore, a collector current $I_{C4}$ of the transistors Q4 is given by the following equation (40) in the same way as that of the first differential pair.

$$I_{C4} = I_S \exp\left(\frac{V_{BE5}}{V_T}\right) \exp\left(-\frac{V_i}{V_T}\right) = I_b \exp\left(-\frac{V_i}{V_T}\right) \tag{40}$$

Thus, the output current $I^+$, which is produced by the adder 6 at the output terminal T3, is equal to the sum of the collector currents $I_{C1}$ and $I_{C4}$; i.e., $I^+ = I_{D1} + I_{D4}$. Therefore, the output current $I^+$ is given by the following equation (41).

$$I^+ = I_{C1} - I_{C4} \tag{41}$$
$$= I_b \exp\left(\frac{V_i}{V_T}\right) + I_b \exp\left(-\frac{V_i}{V_T}\right)$$
$$= 2 I_b \cosh\left(\frac{V_i}{V_T}\right)$$

On the other hand, if a collector current of the transistor Q3 is defined as $I_{C3}$, the collector current $I_{C3}$ has the following relationship (42) with the collector currents $I_{C1}$ and $I_{C2}$ of the transistors Q1 and Q2.

$$I_{C1} + I_{C2} + I_{C3} = I_0 \tag{42}$$

Therefore, the collector current $I_{C3}$ is given by the following equation (43), which flows through the transistor Q3 as a bypass current of the first differential pair.

$$I_{C3} = I_0 - I_{C1} - I_{C2} \tag{43}$$
$$= I_0 - I_b \exp\left(\frac{V_i}{V_T}\right) - I_b$$
$$= I_0 - I_b \left\{1 + \exp\left(\frac{V_i}{V_T}\right)\right\}$$

Similarly, in the second differential circuit, a collector current $I_{C6}$ of the transistor Q6 is given by the following equation (44), which flows through the transistor Q6 as a bypass current of the second differential pair.

$$I_{C6} = I_0 - I_{C4} - I_{C5} \tag{44}$$
$$= I_0 - I_b \exp\left(-\frac{V_i}{V_T}\right) - I_b$$
$$= I_0 - I_b \left\{1 + \exp\left(-\frac{V_i}{V_T}\right)\right\}$$

Figure 9:
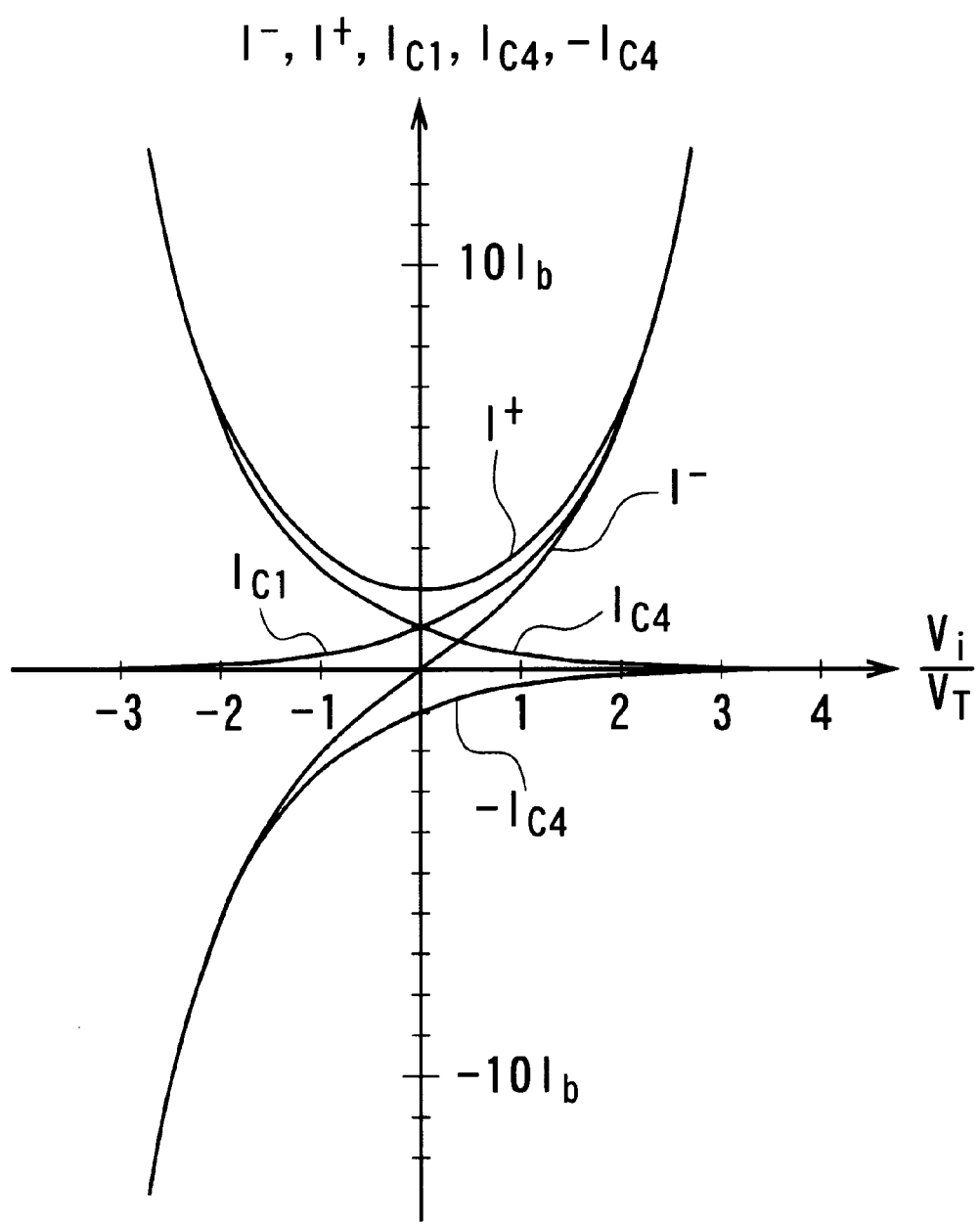
FIG. 9 is a graph showing the transfer characteristics of the bipolar hyperbolic cosine (cosh) and hyperbolic sine (sinh) circuits according to the fourth and fifth embodiments of FIGS. 8A and 8B.

FIG. 9 shows the transfer characteristics of the hyperbolic cosine circuit according to the fifth embodiment. It is seen from FIG. 9 that the output current $I^-(=I_C-I_{C4})$ has an accurate hyperbolic cosine characteristic with respect to the differential input voltage $V_i$.

With the hyperbolic cosine circuit according to the fourth embodiment of FIG. 8A, the bipolar transistor Q2 of the first differential pair is driven by the constant driving current $I_b$ in the first differential circuit. Therefore, the base-to-emitter voltage $V_{BE2}$ of the bipolar transistor Q2 is fixed at a specific value according to the constant driving current $I_b$.

On the other hand, the base-to-emitter voltage $V_{BE1}$ of the bipolar transistor Q1 is equal to a difference between the differential input voltage $V_i$ and the base-to-emitter voltage $V_{BB2}$ of the bipolar transistor Q2.

Accordingly, the base-to-emitter voltage $V_{BB1}$ of the bipolar transistor Q1 varies according to the differential input voltage $V_i$, which means that the collector current $I_{C1}$ of the bipolar transist or Q1 varies according to the exponent of the differential input voltage $V_i$ due to the exponential-law characteristic of the bipolar transistor Q1.

In the second differential circuit, in the same way as the first differential circuit, the base-to-emitter voltage $V_{BE4}$ of the bipolar transistor Q4 varies according to the differential input voltage $V_i$. As a result, the collector current $I_{C4}$ of the bipolar transistor Q4 varies according to the exponent of the differential input voltage $V_i$.

Consequently, as seen from the equation (41), the sum of the collector currents $I_{C1}$ and $I_{C4}$ of the bipolar transistors Q1 and Q4 includes a component proportional to the hyperbolic cosine of the differential input voltage $V_1$. This means that a hyperbolic cosine function is realized.

As described above, an accurate hyperbolic cosine characteristic is realized within a practically wide input voltage range with a simple circuit configuration.

Fifth Embodiment

Figure 8B:
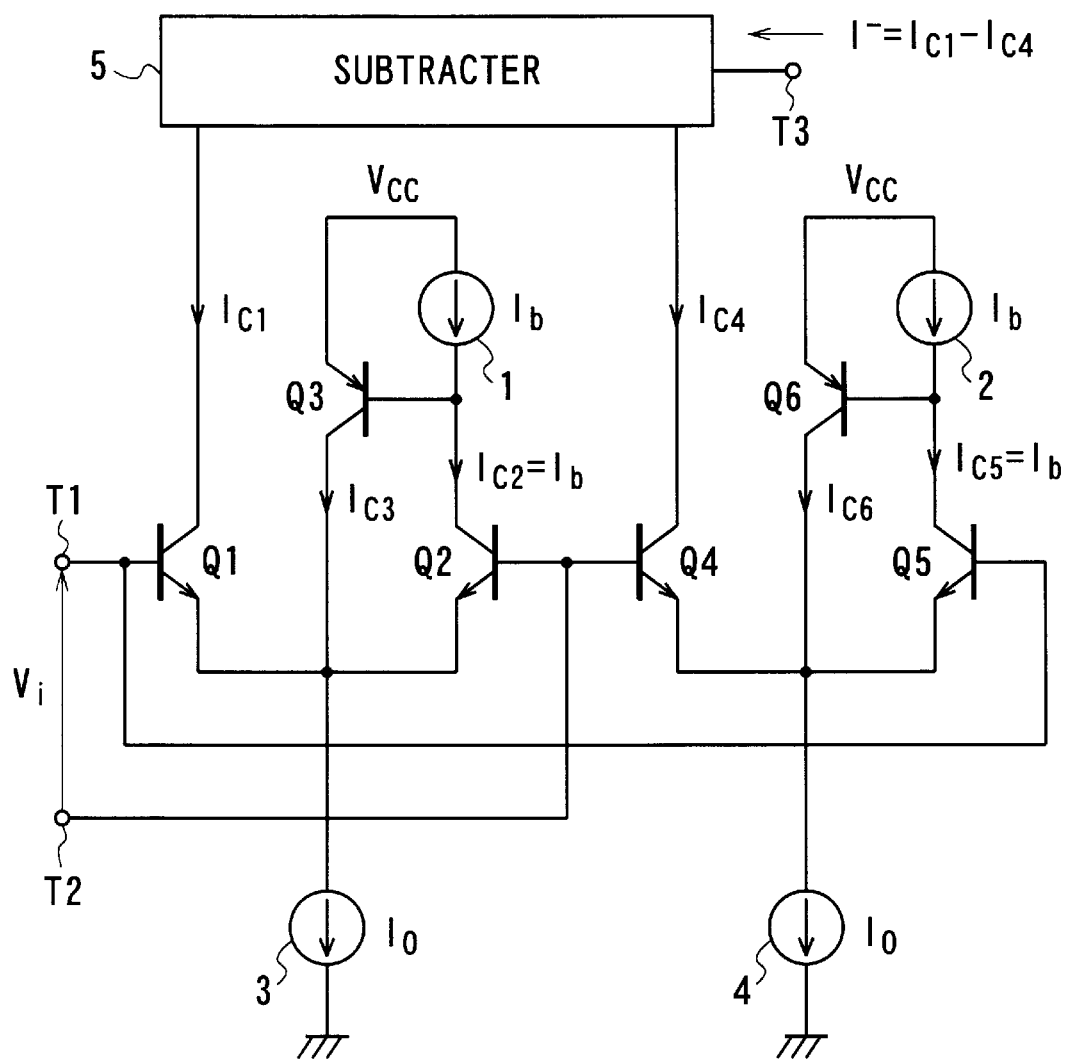
FIG. 8B is a circuit diagram of a bipolar hyperbolic sine (sinh) circuit according to a fifth embodiment of the present invention.

FIG. 8B shows a bipolar hyperbolic sine (sinh) circuit according to a fifth embodiment of the present invention.

As shown in FIG. 8B, this bipolar hyperbolic sine circuit has the same circuit configuration as that of the bipolar hyperbolic cosine circuit according to the fourth embodiment of FIG. 8A except that subtracter 5 is provided instead of the adder 6 in the fourth embodiment. Therefore, explanation about the same configuration as that of the fourth embodiment is omitted here by attaching the same reference symbols as those of the fourth embodiment in FIG. 8B for the sake of simplification of description.

In this circuit, an output current $I^-$ of the hyperbolic sine circuit, which is produced by the subtracter 5 at the output terminal T3, is equal to the difference between the collector currents $I_{C1}$ and $I_{C4}$; i.e., $I^- = I_{C1} - I_{C4}$. Therefore, the output current $I^-$ is given by the following equation (45).

$$I^- = I_{C1} - I_{C4} \quad (45)$$
$$= I_b \exp\left(\frac{V_i}{V_T}\right) - I_b \exp\left(-\frac{V_i}{V_T}\right)$$
$$= 2I_b \sinh\left(\frac{V_i}{V_T}\right)$$

FIG. 9 shows the transfer characteristics of the bipolar hyperbolic sine circuit according to the sixth embodiment. It is seen from FIG. 9 that the output current $I^-(=I_{C1}-I_{C4})$ has an accurate hyperbolic sine characteristic with respect to the differential input voltage $V_i$.

Sixth Embodiment

Figure 10A:
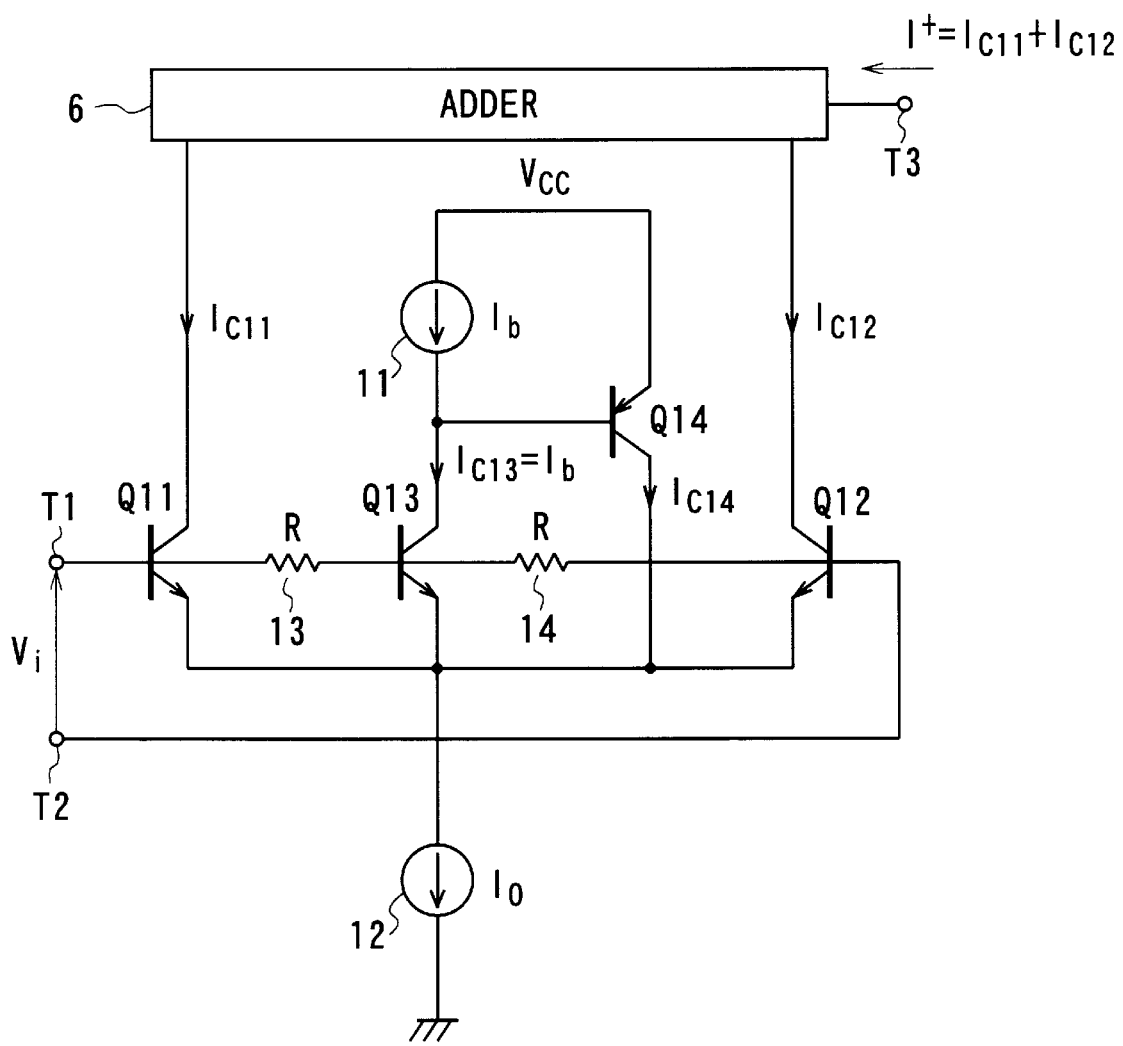
FIG. 10A is a circuit diagram of a bipolar hyperbolic cosine (cosh) circuit according to a sixth embodiment of the present invention.

FIG. 10A shows a bipolar hyperbolic cosine (cosh) circuit according to a sixth embodiment of the present invention. This circuit has a configuration obtained by replacing the MOSFETs M11, M12, M13, and M14 in the CMOS squarer according to the third embodiment of FIG. 6 with bipolar transistors Q11, Q12, Q13, and Q4, respectively. The MOSFET M15 in FIG. 6 is removed and an adder 6 is added thereto.

As shown in FIG. 10A, this hyperbolic cosine circuit is comprised of a single differential circuit.

The differential circuit has a balanced differential pair of emitter-coupled npn-type bipolar transistors Q11 and Q12, an npn-type bipolar transistor Q13 whose emitter is connected to the coupled emitters of the transistors Q11 and Q12, a constant current source 11 for supplying a constant driving current $I_b$, and a pnp-type bipolar transistor Q14 whose collector is connected to the coupled emitters of the bipolar transistors Q11, Q12, and Q13. The emitter areas of the transistors Q11, Q12, Q13, and Q14 are equal to each other.

The coupled emitters of the transistors Q11, Q12, and Q13 are connected to a terminal of a constant current sink 12 sinking a constant current $I_D$. Another terminal of the constant current sink 12 is connected to the ground. The differential pair of the transistors Q11 and Q12 is driven by the constant current $I_0$. The constant current $I_D$ maybe termed a tail current of the differential pair.

Bases of the transistors Q11 and Q12 are connected to input terminals T1 and T2, respectively. A differential input voltage $V_i$ is applied across the bases of the transistors Q11 and Q12 through the input terminals T1 and T2.

A base of the transistor Q13 is connected to the base of the transistor Q11 through a resistor 13 with a resistance R and to the base of the transistors Q12 through a resistor 14 with a same resistance R as the resistor 13. Therefore, the base of the transistor Q13 is applied with a half of the applied differential input voltage $V_i$; i.e., ($V_i/2$).

A collector of the transistor Q13 is connected to a terminal of the constant current source 11. Another terminal of the constant current source 11 is connected to a power supply line (not shown) applied with a power supply voltage $V_{CC}$. The transistors Q13 is driven by the constant driving current $I_b$ produced by the constant current source 11.

A base of the transistors Q14 is connected to the collector of the transistors Q13 and the corresponding terminal of the constant current source 11. An emitter of the transistors Q14 is connected to the power supply line of $V_{CC}$. The transistors Q14 serves as a bypass transistor allowing a part of the constant tail current $I_0$ to flow as a bypass current of the differential pair.

Collectors of the transistors Q11 and Q12 are connected to the adder 6. An output current $I^+$ of the hyperbolic cosine circuit is produced by the adder 6 at an output terminal T3.

Next, the operation of the bipolar hyperbolic cosine circuit according to the sixth embodiment is explained below.

Because a collector currents $I_{C3}$ of the transistor Q3 is expressed as the following equation (46), collector currents $I_{C1}$ and $I_{C2}$ of the transistors Q1 and Q2 are given by the following equations (47) and (48), respectively.

$$I_{C13} = I_S \exp\left(\frac{V_{BE13}}{V_T}\right) = I_b \quad (46)$$

$$I_{C11} = I_S \exp\left(\frac{\frac{V_i}{2} + V_{BE13}}{V_T}\right) \quad (47)$$
$$= I_b \exp\left(\frac{V_i}{2V_T}\right)$$

$$I_{C12} = I_S \exp\left(\frac{-\frac{V_i}{2} + V_{BE13}}{V_T}\right) \quad (48)$$
$$= I_b \exp\left(-\frac{V_i}{2V_T}\right)$$

It is seen that the equation (46) is in a same form as that of the equation (11), in which the saturation current $I_S$ is replaced with the constant driving current $I_b$ and the base-to-emitter voltage $V_{BE}$ is replaced with a half of the differential input voltage; i.e., ($V_i/2$). Similarly, it is seen that the equation (47) is in a same form as that of the equation (11), in which the saturation current $I_S$ is replaced with the constant driving current $I_b$ and the base-to-emitter voltage $V_{BB}$ is replaced with an opposite-shape half of the differential input voltage; i.e., $(-V_i/2)$.

Accordingly, the transistors Q11 and Q12 serve as "floating transistors" that operate independent of the power supply voltage $V_{CC}$ and the ground potential.

Further, if a collector current of the transistor Q14 is defined as $I_{C14}$, the following relationship (49) is established.

$$I_{C11} + I_{C12} + I_{C13} + I_{C14} = I_0 \tag{49}$$

Therefore, the collector current $I_{C14}$ of the transistor Q14, which is the bypass current, is given by the following equation (50).

$$I_{C14} = I_0 - I_b - I_b \cosh\left(\frac{V_i}{V_T}\right) \tag{50}$$

$$= I_0 - I_b\left\{1 + \cosh\left(\frac{V_i}{V_T}\right)\right\}$$

Accordingly, the output current $I^+(=I_{C11}+I_{C12})$ is given by the following equation (51).

$$I^+ = I_{C11} + I_{C12} \tag{51}$$

$$= I_b \exp\left(\frac{V_i}{2V_T}\right) + I_b \exp\left(-\frac{V_i}{2V_T}\right)$$

$$= 2I_b \cosh\left(\frac{V_i}{2V_T}\right)$$

It is seen from the equation (51) that an accurate hyperbolic cosine (cosh) characteristic is realized within a practically wide input voltage range with a simple circuit configuration.

Seventh Embodiment

Figure 10B:
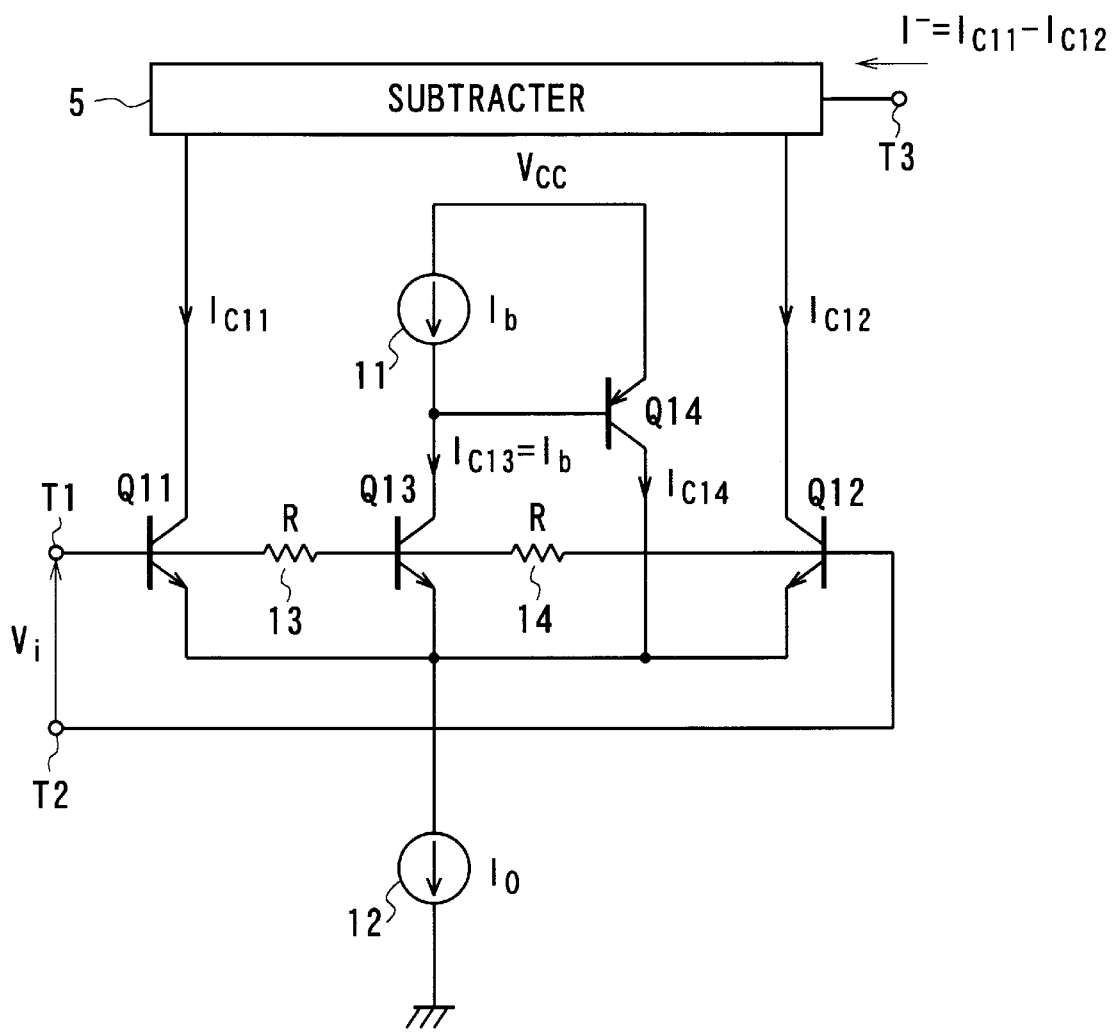
FIG. 10B is a circuit diagram of a bipolar hyperbolic sine (sinh) circuit according to a seventh embodiment of the present invention.

FIG. 10B shows a bipolar hyperbolic sine (sinh) circuit according to a seventh embodiment of the present invention.

As shown in FIG. 10B, this bipolar hyperbolic sine circuit has the same circuit configuration as that of the bipolar hyperbolic cosine (cosh) circuit according to the sixth embodiment of FIG. 10A except that a subtracter 5 is provided instead of the adder 6 in the sixth embodiment. Therefore, explanation about the same configuration as that of the sixth embodiment is omitted here by attaching the same reference symbols as those of the sixth embodiment in FIG. 10B for the sake of simplification of description.

In this circuit, an output current $I^-$ of the hyperbolic sine circuit, which is produced by the subtracter 5 at the output terminal T3, is equal to the difference between the collector currents $I_{C11}$ and $I_{C12}$; i.e., $I^-=I_{C12}$. Therefore, the output current $I^-$ is given by the following equation (52) .

$$I^- = I_{C11} - I_{C12} \tag{52}$$

$$= I_b \exp\left(\frac{V_i}{2V_T}\right) - I_b \exp\left(-\frac{V_i}{2V_T}\right)$$

$$= 2I_b \sinh\left(\frac{V_i}{2V_T}\right)$$

Figure 11:
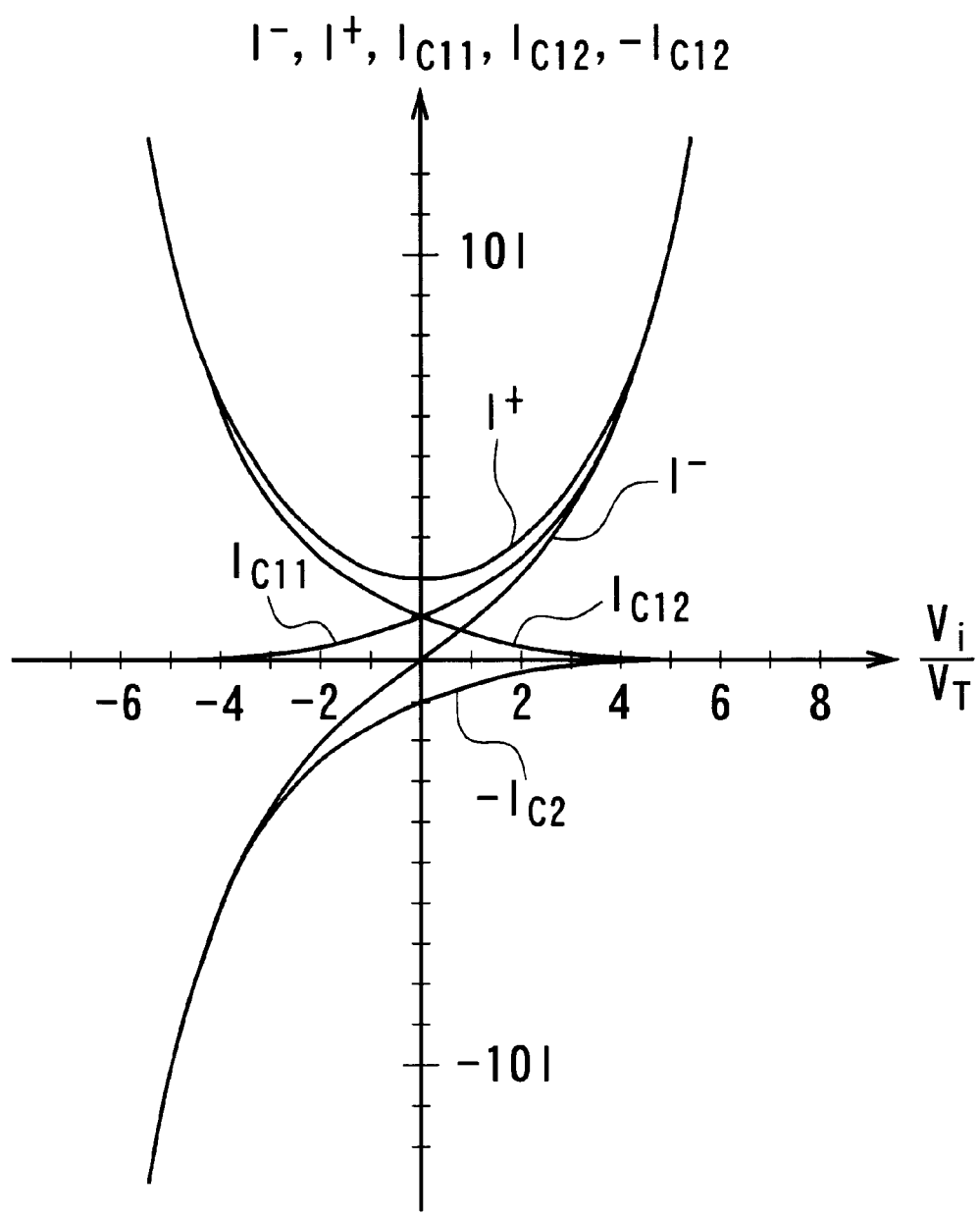
FIG. 11 is a graph showing the transfer characteristics of the bipolar hyperbolic cosine (cosh) and hyperbolic sine (sinh) circuits according to the sixth and seventh embodiments of FIGS. 10A and 10B.

FIG. 11 shows the transfer characteristics of the hyperbolic sine circuit according to the seventh embodiment. It is seen from FIG. 11 that the output current $I^-(=I_{C11}-I_{C12})$ has an accurate hyperbolic sine characteristic with respect to the differential input voltage $V_i$.

As explained in the fourth and fifth embodiments shown in FIGS. 8A and 8B and in the sixth and seventh embodiments shown in FIGS. 10A and 10B, it is seen that the hyperbolic cosine (cosh) and hyperbolic sine (sinh) circuits are realized. On the other hand, a hyperbolic tangent (tanh) circuit can be realized by a popular differential pair of bipolar transistors.

Accordingly, all the hyperbolic functions can be realized by the present invention and as a consequence, various signal processes used in neuro-computers can be accomplished by analog circuits.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:

(a) a first differential circuit having a first differential pair of first and second MOSFETs whose sources are coupled together and a third MOSFET serving as a bypass transistor for said first differential pair;

said first differential pair being driven by a first constant tail current;

said second MOSFET being driven by a first constant driving current;

(b) a second differential circuit having a second differential pair of fourth and fifth MOSFETs whose sources are coupled together and a sixth MOSFET serving as a bypass transistor for said second differential pair;

said second differential pair being driven by a second constant tail current;

said fifth MOSFET being driven by a second constant driving current;

(c) a differential input voltage being applied across gates of said first and second MOSFETs and across gates of said fifth and fourth MOSFETs; and (d) a difference circuit determining a difference of a drain current of said first MOSFET and a drain current of said fourth MOSFET which includes a component proportional to said differential input voltage.

2. A squarer comprising:

(a) a first differential circuit having a first differential pair of first and second MOSFETs whose sources are coupled together and a third MOSFET serving as a bypass transistor for said first differential pair;

said first differential pair being driven by a first constant tail current;

said second MOSFET being driven by a first constant driving current;

(b) a second differential circuit having a second differential pair of fourth and fifth MOSFETs whose sources are coupled together and a sixth MOSFET serving as a by pass transistor for said second differential pair;

said second differential pair being driven by a second constant tail current;

said fifth MOSFET being driven by a second constant driving current;

(c) a differential input voltage being applied across gates of said first and second MOSFETs and across gates of said fifth and fourth MOSFETS; and (d) a summing circuit deferring a sum of a drain current of said first MOSFET and a drain current of said fourth MOSFET which includes a component proportional to a square of said differential input voltage.

* * * * *

UNITED STATES PATENT AND TRADEMARK OFFICE
CERTIFICATE OF CORRECTION

PATENT NO.  : 6,107,858
DATED       : August 22, 2000
INVENTOR(S) : Katsuji Kimura It is certified that error appears in the above-identified patent and that said Letters Patent is hereby corrected as shown below:

Column 1,
Line 28, delete "103" insert -- M103 --;
Line 30, delete "$I_S$" insert -- $I_B$ --

Column 2,
Line 59, delete $T_{D101}$" insert -- $I_{D101}$ --

Column 3,
Line 36, delete $ID_{104}$" insert $I_{D104}$" --

Column 6,
Line 19, delete "$I_D$" insert -- $I_O$ --

Column 11,
Line 56, delete "$M_1$" insert -- M1 --

Column 12,
Line 34, delete "MOSEET" insert -- MOSFET --
Line 62, delete "MOSEST" insert -- MOSFET --

Column 20,
Line 20, delete "$V_{BB1}$" insert -- $V_{BE1}$ --
Line 64, delete "$V_{BB2}$" insert -- $V_{BE2}$ --;
Line 65 delete "base– to" insert -- base-to --;

Column 21,
Line 12, delete "$V_1$" insert -- $V_i$ --

Column 22,
Line 6, delete "$I_D$" insert -- $I_O$ --;
Line 9, delete "$I_D$" insert -- $I_O$ --;
Line 22, delete "11is" insert -- 11 is --

UNITED STATES PATENT AND TRADEMARK OFFICE
CERTIFICATE OF CORRECTION

PATENT NO. : 6,107,858
DATED : August 22, 2000
INVENTOR(S) : Katsuji Kimura

It is certified that error appears in the above-identified patent and that said Letters Patent is hereby corrected as shown below:

Column 23,
Line 1, delete "$V_{BB}$" insert -- $V_{BE}$ --;
Line 42, delete "5is" insert -- 5 is --;
Line 50, after "$\overline{I}$ =" insert $I_{C11}$ --

Signed and Sealed this

Seventh Day of August, 2001

Attest:

NICHOLAS P. GODICI
*Attesting Officer*   *Acting Director of the United States Patent and Trademark Office*